(12) United States Patent
Sakamoto et al.

(10) Patent No.: US 6,975,022 B2
(45) Date of Patent: Dec. 13, 2005

(54) BOARD FOR MANUFACTURING A BGA AND METHOD OF MANUFACTURING SEMICONDUCTOR DEVICE USING THEREOF

(75) Inventors: Noriaki Sakamoto, Gunma (JP); Yoshiyuki Kobayashi, Gunma (JP); Junji Sakamoto, Gunma (JP); Shigeaki Mashimo, Gunma (JP); Katsumi Okawa, Gunma (JP); Eiju Maehara, Gunma (JP); Kouji Takahashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 383 days.

(21) Appl. No.: 09/809,917

(22) Filed: Mar. 16, 2001

(65) Prior Publication Data

US 2001/0045625 A1 Nov. 29, 2001

(30) Foreign Application Priority Data

May 24, 2000 (JP) .................................. P. 2000-152429

(51) Int. Cl.⁷ .......................................... H01L 23/495
(52) U.S. Cl. ..................... 257/676; 257/738; 438/459
(58) Field of Search .............................. 257/676, 738; 438/459

(56) References Cited

U.S. PATENT DOCUMENTS

| 5,891,758 A | 4/1999 | Honda et al. |
| 5,969,426 A | 10/1999 | Baba et al. |
| 5,976,912 A * | 11/1999 | Fukutomi et al. ............ 438/110 |
| 6,001,671 A * | 12/1999 | Fjelstad ....................... 438/112 |
| 6,215,179 B1 * | 4/2001 | Ohgiyama .................... 257/676 |
| 6,247,229 B1 * | 6/2001 | Glenn ........................... 29/841 |
| 6,348,726 B1 * | 2/2002 | Bayan et al. ................. 257/666 |
| 6,373,140 B1 * | 4/2002 | Onodera et al. ............. 257/780 |
| 6,498,099 B1 * | 12/2002 | McLellan et al. ........... 438/689 |

FOREIGN PATENT DOCUMENTS

| EP | 0751561 A1 | 1/1997 |
| JP | 10313082 | 11/1988 |
| JP | 10-340925 | 12/1998 |
| JP | 11163024 | 6/1999 |
| JP | 11195733 | 7/1999 |
| JP | 2000-150707 | 5/2000 |
| JP | P3503502 | 12/2003 |

OTHER PUBLICATIONS

CSP Technology, and mounting material and device supporting the technology–special issue of Denshi Zairyo.

* cited by examiner

*Primary Examiner*—Amir Zarabian
*Assistant Examiner*—Jeff Vockrodt
(74) *Attorney, Agent, or Firm*—Fish & Richardson P.C.

(57) ABSTRACT

A device containing a flat member is provided, having a pattern for a bonding pad, a wiring, and an electrode, by half-etching through the flat member.

21 Claims, 15 Drawing Sheets

150    154

150  152  154

153

BOARD FOR MANUFACTURING A BGA AND METHOD OF MANUFACTURING SEMICONDUCTOR DEVICE USING THEREOF

BACKGROUND OF THE INVENTION

1. Field of the Invention

The present invention relates to a board for manufacturing a BGA (Ball Grid Array) and a method for manufacturing a semiconductor device using thereof.

2. Description of the Related Art

An IC package for a portable equipment or a small, hi-density mounting equipment has advanced in recent years. Details of these advances are described in CSP technology, and mounting material and device supporting the technology—special issue of DENSHI ZAIRYO (p.22, Set. 1998).

FIGS. 15A and 15B show a BGA using a flexible sheet 50 as an inter-poser board. FIG. 15A is a plan view, and FIG. 15B is a section view cut at A—A line.

On the flexible sheet 50, a copper foil pattern 51 is bonded by an adhesive. An IC chip 52 is fixed on the flexible sheet 50 and a bonding pad 53 is formed around the IC chip 52 with the copper foil. A solder-ball connecting pad 55 is formed through a wiring 54, which is integrated with the bonding pad 53. A solder-ball is then formed on the connecting pad 55.

In FIG. 15A, the flexible sheet 50 is indicated peripherally in solid line, and the IC chip 52 is indicated by a rectangle in solid line. At inside the bonding pads 53 formed around the IC chip 52, the solder-ball connecting pads 55 are arranged in matrix-shape.

At a rear side of the solder-ball connecting pads 55, an opening portion 57 is formed by processing the flexible sheet 50, and the solder-ball 56 is formed through the opening portion 57.

The flexible sheet 50 is used as a ceramic board and printed board, and a member is processed thinly among these boards. However a flexible sheet is expensive compared to a ceramic board and printed board. Moreover, using these boards would increase the cost of a BGA substantially including the cost to machine the opening portion 57.

Thin and lightweight types are desired for a semiconductor device used in a portable equipment and also for a BGA. However, generally the process of forming a Cu foil pattern, of mounting the IC chip 52, and of bonding wire 58 would require the use of a flexible sheet 50 as a supporting board. Therefore, the flexible sheet 50 would have to be used in view of the manufacturing processes.

Moreover, the Cu foil pattern tends to deform or peel off because the Cu foil pattern is bonded with adhesive on the flexible sheet 50. As the numbers of pads of the IC chip 52 increases year and year, making finer Cu foil patterns is needed with the BGA. Consequently, bonding area of the wiring 54 and bonding pad 53 are decreased, thereby becoming more susceptible to deformities or peeling of the Cu foil pattern.

Furthermore, manufacturing a BGA requires much time because a semiconductor manufacturer would have to inform a flexible sheet vendor on the designated pattern data, the flexible sheet manufacturer would then have to manufacture the flexible sheet, and the semiconductor manufacturer would then purchase the completed flexible sheet. Accordingly, manufacturing a semiconductor device as a product would require a considerable amount of time. The semiconductor manufacturer cannot deliver the BGA to a user in short time.

Also, heat from the IC chip 52 is insufficiently radiated because the flexible sheet 50 is interposed between the Cu foil pattern 51 and the IC chip 52.

SUMMARY OF THE INVENTION

An embodiment of the present invention is a board for manufacturing a BGA, having a first face including a flat face and a second face formed opposite to the first face, which has a flat face. On the second face, a first conductive film has substantially the same pattern as a bonding pad provided at a periphery of a semiconductor element mounting area, and a wiring extends to the semiconductor element mounting area in one body with the bonding pad. An electrode is also formed in one body with the wiring.

Another embodiment of the invention is a flat member having a first face including a flat face and a second face formed opposite to the first face, which has a flat face. On the second face, a photo resist having substantially the same pattern as a bonding pad is formed at a periphery of the semiconductor element mounting area. A wiring extends to the semiconductor element mounting area in one body with the bonding pad. An electrode is formed in one body with the wiring. In another embodiment, at an area corresponding to the bonding pad, a conductive film is formed. The photo resist is provided to cover the film.

By half-etching through the conductive film or the photo resist formed on the flat board, a conductive pattern is formed, supported by the flat member. Therefore, a semiconductor manufacturer with etching facilities can manufacture a semiconductor device consistently from a flat member.

Because a flat member is used as a supporting board in fixing a semiconductor element, an electric connection is formed using a bonding wire, and a sealing is provided by using insulating resin, and a conventional flexible sheet as a supporting board is not need. Although the bonding pad is thin and exists in island-shape, and the wiring is arranged in a rather precarious state because of its length and thinness, deformation such as bending or peeling is avoided because they are made in one body with the flat member.

Because of half-etching, the pattern of the flat member is not removed at its face, and the interval between the conductive patterns can be made narrow so that a finer pattern can be formed. Further, separating the pad and the wiring is possible by polishing or etching the back of the flat member after entirely fixing the flat member with an insulating resin. The pattern is arranged in a designated position without a gap and deformation even with long wirings.

In the case of half-etching the photo resist as a mask, a wire bonding is provided by forming a conductive film at the bonding pad.

In another embodiment, a pattern can be as substantially the same as a guide pin or a guide hole where the guide pin is inserted at side parts of the flat member facing each other so that a die mounting area of the flat member is carried out in high accuracy at molding.

In another embodiment, the flat member includes a conductive foil and the conductive film includes material different from the conductive foil.

By forming the conductive film, the side face of the projection is bent and further eaves are formed at the conductive film. Therefore, a bonding pad and a wiring being conductive pattern are buried in insulating resin with an anchoring effect.

Another embodiment of the invention is a flat member having a first face including a flat face and a second face having a projection formed in desired heights and being formed opposite to the first face. A bonding pad is provided at a periphery of a semiconductor element mounting area. A wiring extends to the semiconductor element mounting area in one body with the bonding pad. An electrode is provided in one body with the wiring.

A conductive film can be formed at a surface of said projection or at least at an area corresponding to the bonding pad.

The flat member includes a conductive foil, and the conductive film includes material different from the conductive foil.

Manufacturing a flat member provided with projections, a mounting semiconductor, an electric connection to a pad, and sealing the above members are all possible within the facilities of a semiconductor manufacturer. Therefore, a flat member can be provided by a material manufacturer and the semiconductor manufacturer can manufacture a semiconductor device of a BGA type.

Further, the flat member may be transferred easily without shifting and can bond well to other elements.

Because a flat member is used as a supporting board in fixing a semiconductor element, an electric connection can be formed by using a bonding wire, and a sealing can be formed by using insulating resin. Thus, a conventional flexible sheet can be obviated. Although the bonding pad exists in island-shape and is arranged in a precarious state, deformation such as bending or peeling is avoided because the flat member is made in one body. Although bending or peeling may occur when there are long extended wirings, this problem is avoided when the bonding pad is provided in one body with the flat member.

The interval between the pads or the conductive patterns is made narrow so that a thin pattern can be formed. Further, separating the pad, die pad, and the wiring is possible by polishing or etching the back of the flat member after fixing the member with insulating resin. The pattern is arranged in a designated position without a gap.

A projection of a pattern can be as substantially the same as a guide pin or guide hole where the guide pin is inserted.

The designated pattern includes a projection in matrix shape so that mass production is possible.

The flat member includes Cu, AL, Fe—Ni alloy, a layered product of Cu—AL, or a layered product of Al—Cu—Al.

A side face of the projection has an anchoring structure.

The conductive film can provide eaves at an upper face of the projection.

The conductive film made of at least one of Ni, Au, Ag, and Pd, has an anchoring effect. Also, wire bonding and die bonding are possible.

Another embodiment of the invention is a flat member having an entire flat back face corresponding to a resin sealing area and a front face having a projection at an area surrounded by an upper die and a contacting area. The projection has a bonding pad provided at a periphery of a semiconductor element mounting area, a wiring extending to the semiconductor element mounting area in one body with the bonding pad, and an electrode provided in one body with the wiring. At least the area surrounded by a contacting area with the upper die provides a sealing space with the surface and the upper die.

Another embodiment of the invention is a flat member having an entire flat back face corresponding to a resin sealing area and a front face having a projection. The projection has a bonding pad provided in an area surrounded by a contacting area to an upper die, a wiring extending to the semiconductor element mounting area in one body with the bonding pad, and an electrode provided in one body with the wiring.

Another embodiment provides a process for mounting a semiconductor element at the semiconductor mounting area and electrically connecting the bonding pad and the semiconductor element, a process for mounting the flat member on a die and filling resin into the space provided by the flat member and the upper die, and a process for separating the projections respectively by removing the flat member to expose the back face of the resin.

Still another embodiment of the invention is a method for manufacturing a semiconductor device where all of the back face of the flat member corresponding to the resin-sealing area contacts a lower die.

The contacting area of the lower die can be a scattering vacuum suction means.

The dividing step includes etching an entire surface of the flat member to a predetermined depth or grinding an entire surface of the flat member to expose the resin.

The dividing step can also include etching and grinding the flat member to expose the resin.

Because the flat member is formed in sheet shape, the back face of the flat member is contacted in all faces of the lower die. Moreover, a conductive pattern such as a pad does not make any burr thereof at the back face of the flat member because the conductive pattern is provided in the sealing space.

A conductive pattern and a semiconductor element are sealed with insulating resin. A flexible sheet is then removed to realize a thin, light semiconductor device. Moreover, by burying a wiring and forming a conductive film on the surface of a conductive foil, a bonding pad or a wiring having eaves at its face is formed to provide an anchoring effect. Therefore, a semiconductor device of a BGA type, which reduces or prevents deformation such as bending and peeling of the conductive pattern, can be obtained.

DESCRIPTION OF THE PREFERRED EMBODIMENTS

The invention relates a semiconductor device with bonding pads arranged at a periphery of a semiconductor chip and electrodes in matrix-shape using wirings integrated with the bonding pads. Although, the above may generally be classified as a BGA in which a solder ball is attached at the electrode, it is referred here as a semiconductor device of a BGA constructions.

First Embodiment

Figure 1A:
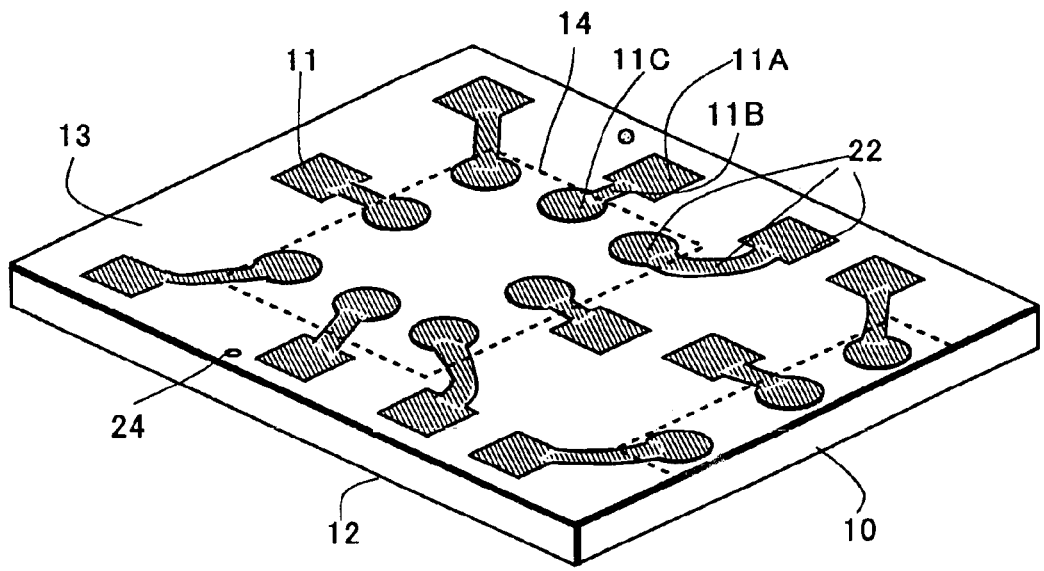
FIG. 1 illustrates a flat member of the invention.

FIG. 1A shows a flat member which is made thinner than a conventional flexible sheet.

In the flat member 10, a conductive pattern that would be printed on a conventional flexible sheet in a BGA is formed with a conductive film 11.

That is, the flat member 10 has a first face 12 including a flat face and a second face 13 including a flat face opposite to the first face 12. On the second face 13, a first conductive film 11A with substantially the same pattern as a second bonding pad 17 is formed at a periphery of a semiconductor mounting area 14. The first conductive film 11A is provided corresponding to a first bonding pad 16 on a semiconductor element 15 shown in FIG. 3 and is formed in substantially the same pattern as the second bonding pad 17. A second conductive film 11B has substantially the same pattern as a wiring 18 provided in one body with the above-mentioned second bonding pad 17. A third conductive film 11C has substantially the same pattern as an electrode 19. These conductive films 11A to 11C may be made in the same material or not. However, for the conductive films 11A to 11C, the material available for an etching resist mask is selected, and this would be made clear later in reference to the manufacturing method. For the surface of the conductive film 11A, a bonding wire 20 may include Au or Al in connection with the ball bonding method or ultrasonic bonding method.

Figure 13A:
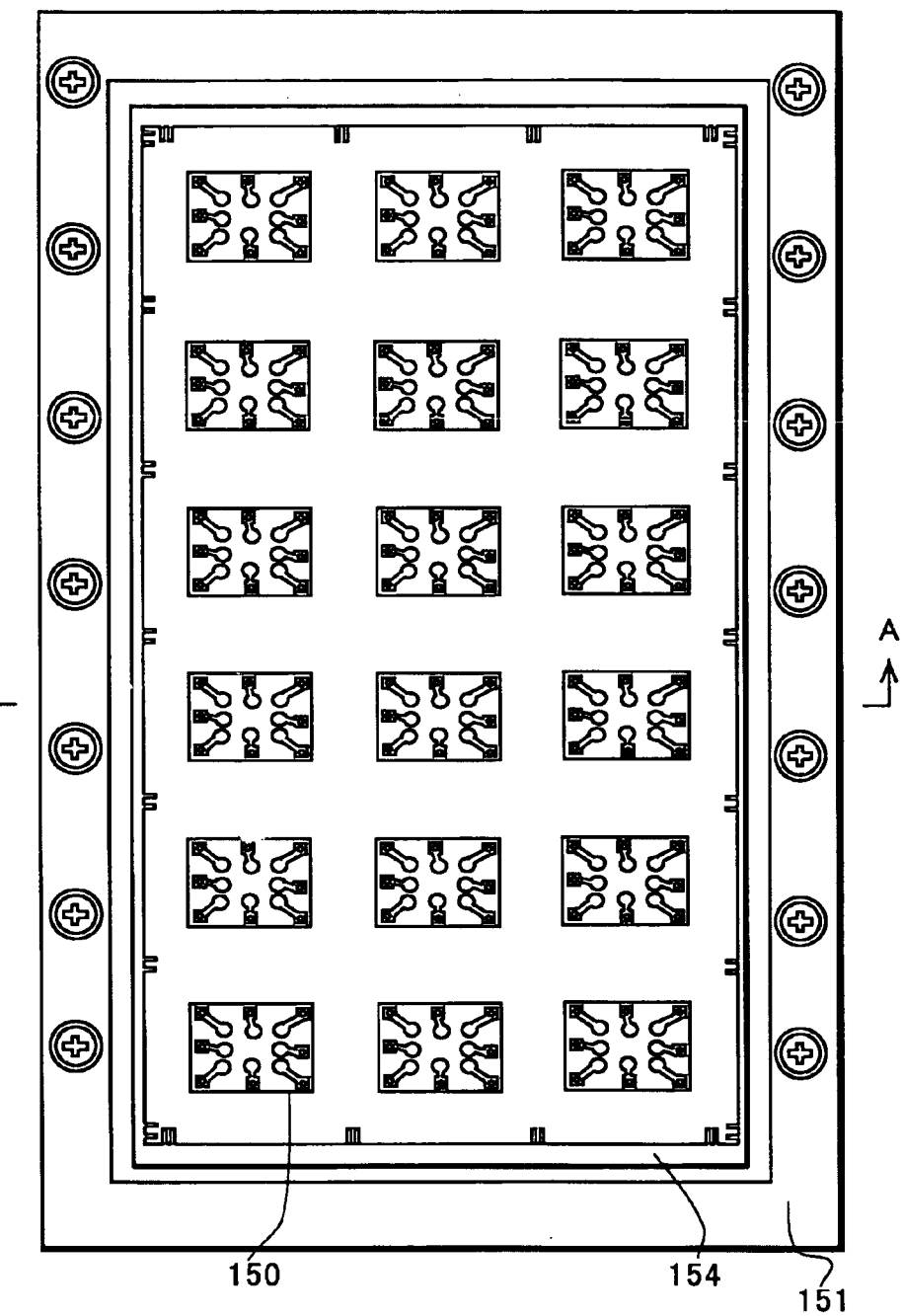
FIG. 13 illustrates a method for manufacturing a semiconductor device adopting a flat member of the invention.
Figure 13B:
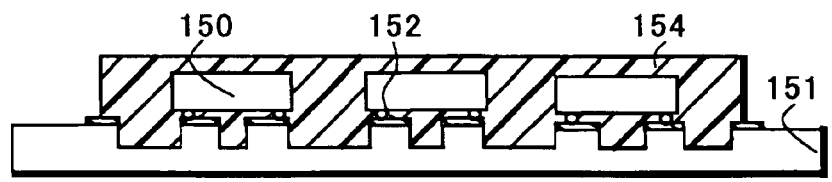

In FIGS. 13A and 13B, the brazing filler metal and conductive paste are selected for the conductive film 11A when a facedown-type element (SMD) is used as the semiconductor element 15.

Figure 1B:
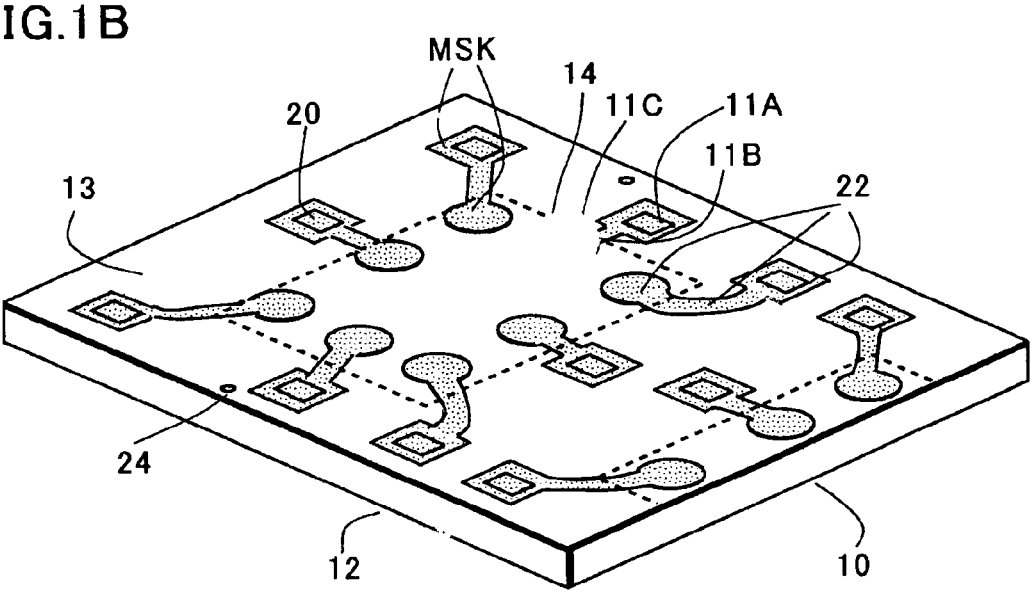

On the flat member 10, an etching resist mask MSK such as a photo resist may be formed instead of the conductive film 11 as shown in FIG. 1B. In this case, a conductive film 20 is formed at a part corresponding to at least the second bonding pad 17 so that bonding using a bonding wire or a facedown bonding is possible, and all patterns including the conductive film is covered by a photo resist MSK.

The invention is in the flat member 10. The flat member 10 is half-etched through the conductive film 11 or the photo resist MSK thereof. The semiconductor 15 is mounted thereon and is sealed by an insulating resin 21. The flat member 10 exposed at the back face of the insulating resin 21 is processed by etching, grinding or polishing etc. untill a conductive pad 22 including the second bonding pad, the wiring 18, and the electrode 19 is separated. The semiconductor device is constructed by three materials: the semiconductor element 15, a conductive pattern 22, and the insulating resin 21 which seals the semiconductor element 15 and the conductive pattern 22. The flat member 10 functions as a semiconductor device 23 of a BGA.

The conductive film 11 or the etching-resist mask MSK is formed on the surface of the flat member 10 for half-etching.

Generally, lateral directional etching advances with the advance of longitudinal directional etching. For example, this phenomenon appears in isotropic etching where the depth of longitudinal directional etching and the length of lateral directional etching are substantially the same. In anisotropic etching, the length of lateral directional etching is shorter than in the case of isotropic etching.

Figure 15A:
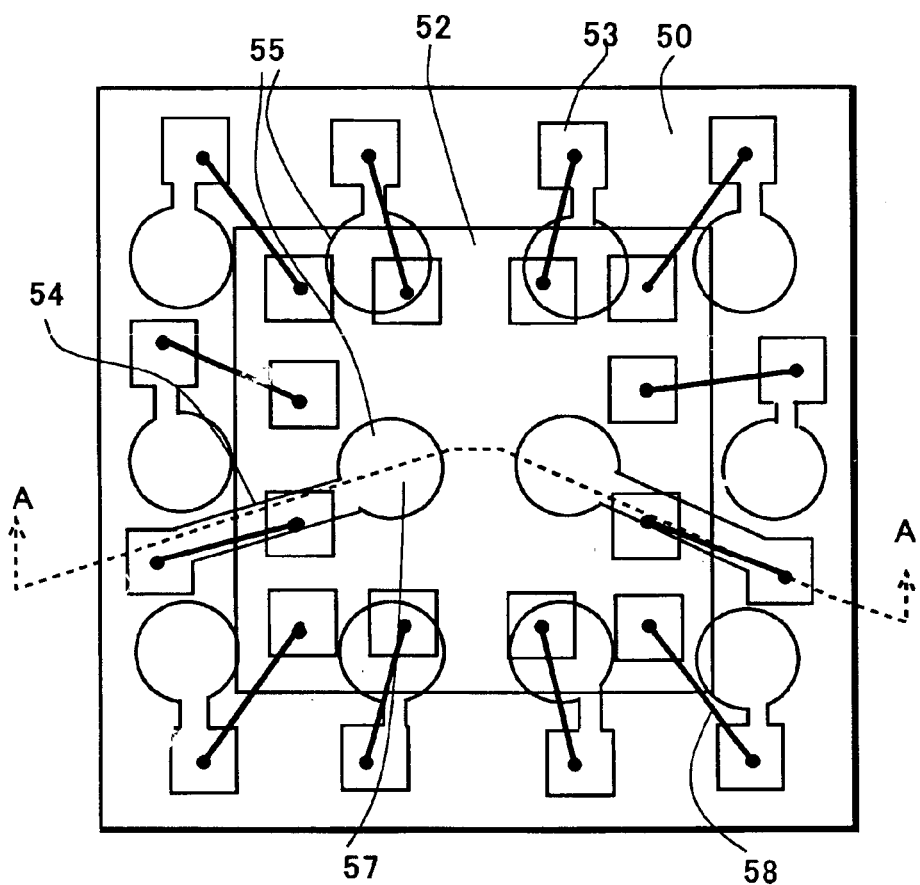
FIG. 15 shows a conventional semiconductor device of a BGA structure.
Figure 15B:
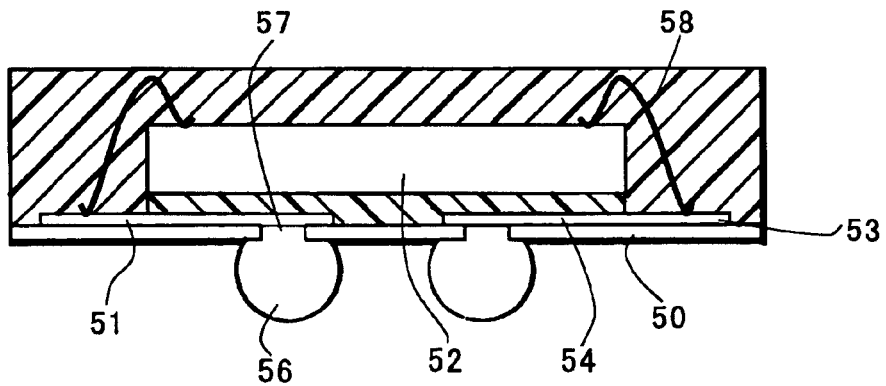

For example, in the semiconductor device with the BGA structure shown in FIG. 15, in the case of forming conductive patterns 53 to 55 on a flexible sheet 50, it would be necessary to remove the patterns to pass through from the face to the back of the bonded Cu foil. However, the interval of conductive patterns is etched even to the lateral direction. The interval of the conductive pattern 22 and adjacent conductive pattern thereto cannot be made smaller than a certain limit because of the correlation with the thickness of the Cu foil. Even with other semiconductor devices of a BGA construction adopting etching-type lead frames, a similar phenomenon appears. Even with removing the lead frame by pressing, the thickness of the lead frame is minimal between leads of the lead frame so that there would be a limit to the fine pattern that can be achieved.

However, by forming the conductive film 11 or the etching-resist mask MSK and then half-etching in depths suitable for fine pattern forming, the etching in the lateral direction is reduced so that finer conductive pattern 22 can be realized.

When conductive film 11 such as Ni, Ag, Au, Pd, as a conductive film is formed on the flat member 10 of thickness of 2 oz. (70 $\mu$m) and when the film is etched untill entirely passed through using a mask, the interval of the conductive pattern is about 70 $\mu$m in the narrowest case. However, by using the conductive film 11 as an etching-resist mask and by etching the flat member 10 to the depth of 35 $\mu$m, the interval of the conductive patterns can be processed to the depth of 35 $\mu$m. That is, efficiency is increased by two fold. The finer pattern is possible because of the shallower depth acheived by half-etching the flat member 10.

In the flat member 10 according to the invention, wet etching is desirable in consideration of etching facilities, mass-productivity, and manufacturing costs. However, wet etching is non-anisotropic and etching in the lateral direction is comparatively large. Therefore, half-etching using the conductive film 11 and the etching-resist mask MSK would be superior for obtaining a finer conductive pattern 22.

In the flat member 10 of the invention, the conductive pattern 22 does not slip and bend as long as the flat member 10 is fixed because the half-etched conductive pattern 22 is made in one body with the flat member 10. The flat member can stably bond to the second bonding pad 17.

Support is needed for the conductive pattern with hanging lead in the semiconductor device with a BGA structure forming the above-mentioned lead frame. However, support is not need for the present invention. Therefore, the conductive pattern 22 is arranged at any position without any consideration to crossing the hanging lead. Consequently, the design of the conductive pattern 22 becomes easy.

A guide hole 24 may be provided when mounting the flat member 10 on a die.

The guide hole 24 may be opened before molding by drill, punching, or etching along the pattern patterned by a conductive film or a photo resist into a round shape at a corresponding position with substantially the same shape as a guide pin. Inserting the guide pin of the die into the guide hole 24 makes molding with high positional accuracy possible.

As mentioned above, the conductive pattern 22 is formed by half-etching through the conductive film 11 or the etching-resist mask MSK, and this is possible to adopt in place of a conventional flexible sheet or a conventional lead frame.

A semiconductor manufacturer generally has plants for front process and back process (back-end process) separately. In the back process molding adopting the flat member 10, generally etching facilities are not set up. Therefore, the semiconductor manufacturer can manufacture a semiconductor device 23 of a BGA construction using the flat member by setting up film-making facilities and etching facilities for the conductive film 11 and by purchasing the flat member 10 where the conductive film 11 or the etching-resist mask MSK is formed from a metal material manufacturer that manufacturs lead frames.

Figure 1C:
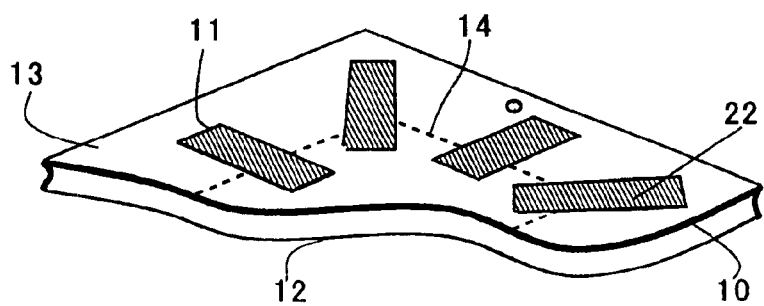
Figure 2A:
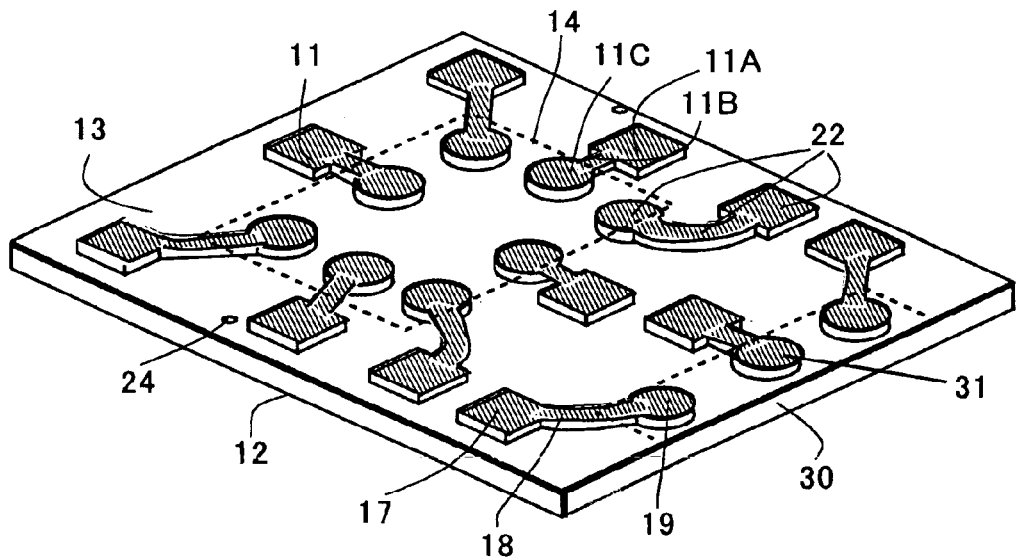
FIG. 2 illustrates a flat member of the invention.
Figure 2B:
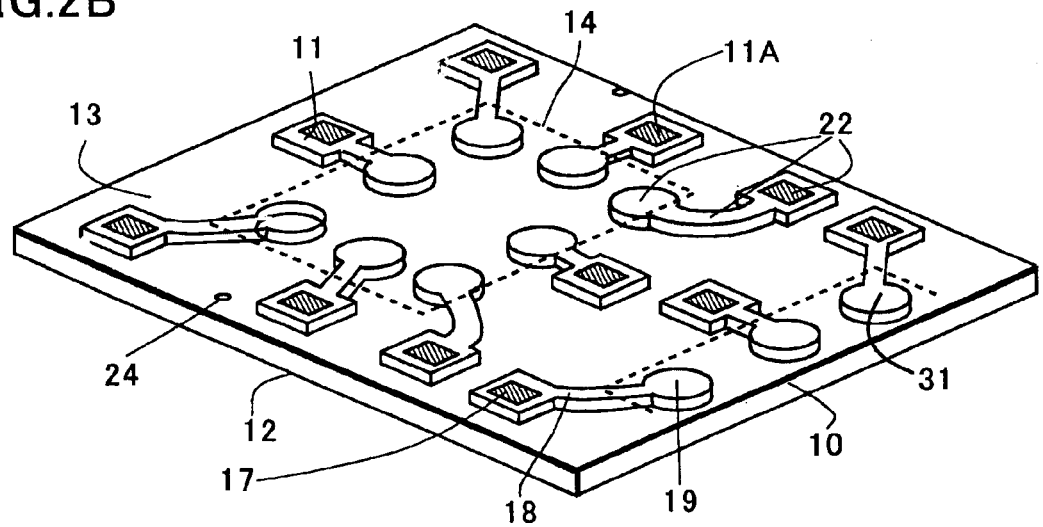
Figure 2C:
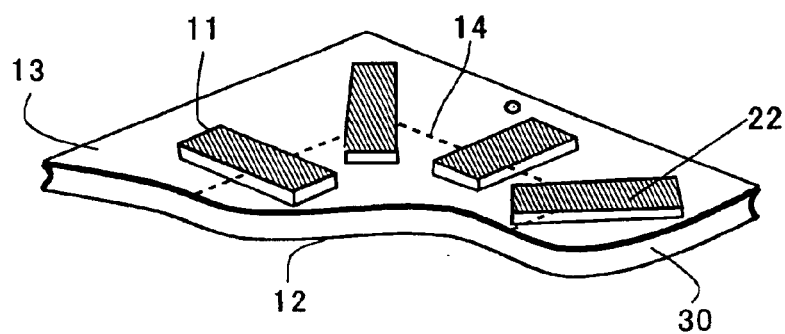

The conductive pattern 22 may be have a shape of a wiring having substantially a constant width from an end to other end as shown in FIG. 1C. Although, the pad 11A and the electrode 11C of FIG. 1A and FIG. 1B are rectangular and circular respectively, such shape is optional.

Second Embodiment

The flat member 30 is half-etched through the conductive film 11 or etching-resist mask MSK, and a conductive pattern 22 is formed in projection shape.

That is, a flat member 30 has a first face 12 including a flat face and a second face 13 having a projection 31 formed in a desired height and being formed opposite to the first face 12. The projection 31 includes a second bonding pad 17 provided at a periphery of a semiconductor element mounting area 14, a wiring 18 of one body with the second bonding pad, and an electrode 19 provided in one body with the wiring.

The flat member 30 is substantially the same in construction and same in effect as the flat member 10 described in the first embodiment. A difference is that the conductive pattern is half-etched.

A semiconductor manufacturer, particularly for back processing, usually does not have plating facilities of a flat member 10 comprising Cu and lithography facilities for etching and so on. Therefore, by purchasing the flat member 30 having the conductive pattern 22 including the projection using half-etching, the flat member 30 can be handled as the same as the conventional lead frame so that it may be possible to manufacture the semiconductor device 23 of a BGA construction with existing facilities for back processing.

The conductive pattern 22 comprising the projection can be made by pressing the flat member 10. In this, the first face 12 which may have projections should be made flat by polishing or grinding.

Third Embodiment

Figure 3A:
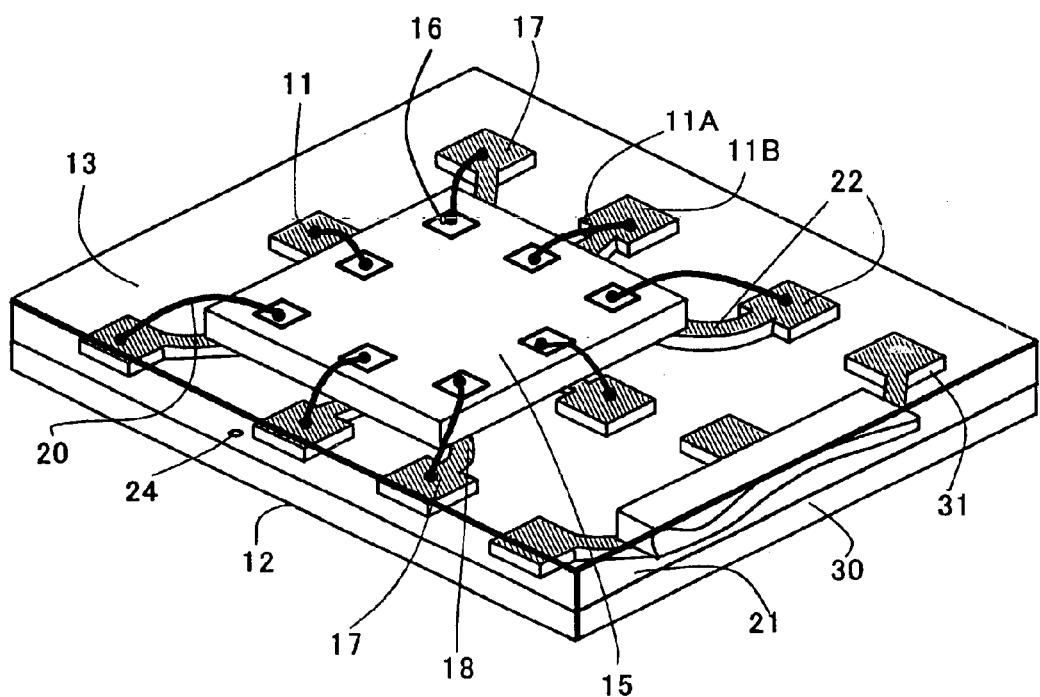
FIG. 3 illustrates a method for manufacturing a semiconductor device adopting a flat member of the invention.
Figure 3B:
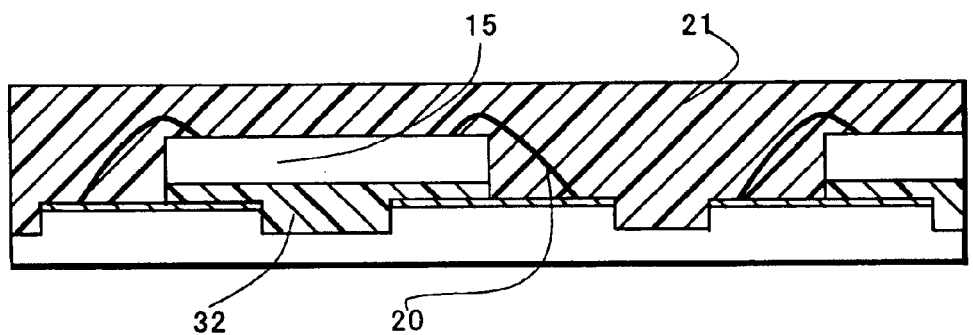
Figure 4A:
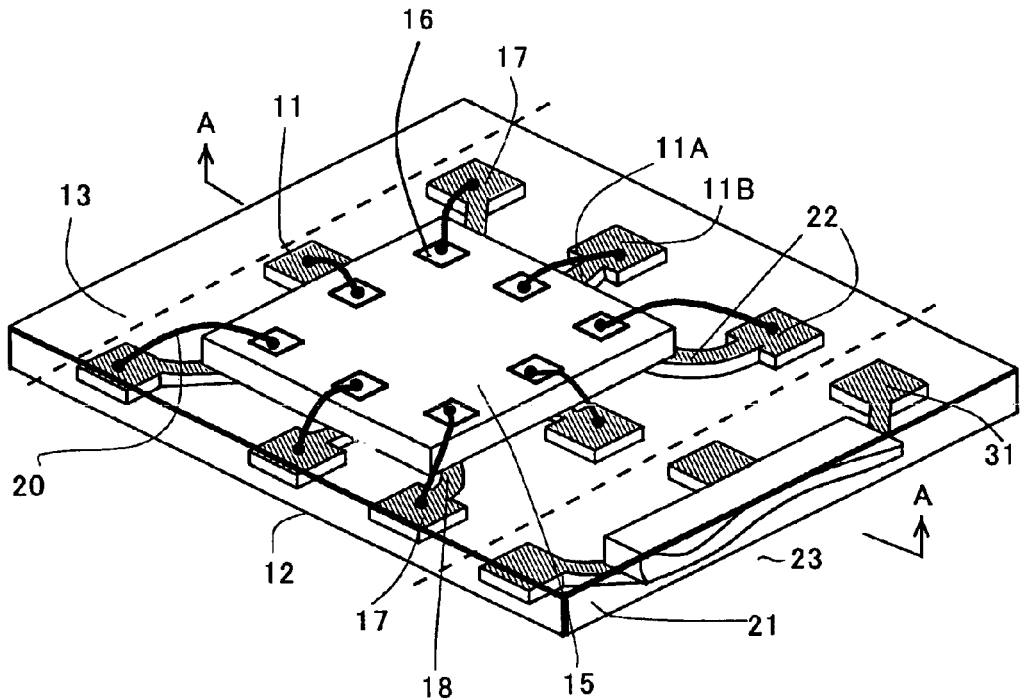
FIG. 4 illustrates a method for manufacturing a semiconductor device adopting a flat member of the invention.

Manufacturing the semiconductor device 23 with a BGA structure using the above-mentioned flat member 10 or 30 is described referring to FIG. 1 to FIG. 4. FIG. 2A shows the flat member 10 of FIG. 1A half-etched. FIG. 2B shows the flat member 10 of FIG. 1B half-etched. FIG. 2C shows the flat member 10 of FIG. 1C half-etched. In FIGS. 3 and 4, the flat member is assumed to be manufactured similarly as in FIG. 1A and FIG. 2A.

In the flat member 10, the first face 12 and the second face 13 are flat. An etching-resist mask MSK of a conductive film 11 or a photo resist shaped into a conductive pattern 22 are formed on the second face 13. In FIG. 1A, the conductive film 11 is formed on all faces of the conductive pattern 22, shown by hatched diagonal lines. In FIG. 1B, a photo resist MSK is used instead of the conductive film 11 and covers a conductive film 11A formed at a part corresponding to at least a second bonding pad 17. The photo resist MSK is shown hatched with dots. (Refer FIG. 1 about the above.)

The flat member 10 is half-etched through the conductive film 11 or the photo resist MSK. The depth of etching is shallower than thickness of the flat member 10. By having the shallower depth of etching, the forming of fine pattern is possible.

By half-etching, the conductive pattern 22 projects out from the second face 13 of the flat member 10 as FIG. 2. The flat member 10 may be made of Cu material, Al material, Fe—Ni alloy material, a layered product of Cu—Al, or a layered product of Al—Cu—Al. Particularly a layered product of Al—Cu—Al can prevent any bends generating by the difference in the thermal expansion coefficients.

For example, by purchasing the flat member 10 of FIG. 1 from a frame manufacturer if a semiconductor manufacturer has etching facilities for back processing, and by purchasing the flat member 30 which the conductive pattern thereof is half-etched in projection shape if the semiconductor manufacturer does not have etching facilities, the process can proceed to the next process. (Refer FIG. 2 about the above.)

A semiconductor element 15 is then fixed to a semiconductor mounting area 14, and a first bonding pad 16 of the semiconductor element 15 and a second bonding pad 17 are electrically connected. In the figure, a bonding wire 20 is used for connection because the semiconductor element 15 is mounted face-up. For the facedown mounting, solder bump, brazing material such as solder ball, conductive paste such as Ag and Au, conductive ball, or anisotropic conductive resin can be used for connection.

In this bonding, the second bonding pad 17 is in one body with the flat member 30. Moreover, the back face of the flat member 30 is flat. Therefore, the flat member 30 can contact a table of a bonding machine face-wise. Therefore by entirely fixing the flat member 30 on the bonding table without causing the second bonding pad 17 to deviate, bonding energy can be transferred to the bonding wire 20 and the second bonding pad 17 so that strength of the bonding wire 20 is improved. Fixing the bonding table is possible by providing multiple vacuum suction holes V for the table as shown in FIG. 9, for example.

For fixing the semiconductor element 15 and the flat member 30, an insulating adhesive 32 can be used. In considering radiation, filler such as Si oxide, Al oxide, and may be mixed the insulating adhesive 32.

Then an insulating resin 21 is formed to cover the conductive pattern, the semiconductor element 57, and the connecting means.

For example, for a sealing using a die, a guide hole 24 is provided on the flat board, and a guide pin of the die is inserted into the hole. Because the first face 12 of the flat member 30 is flat, the face of the lower die is also formed flat. Any methods of thermal plasticity and thermo-hardening can be used for the insulating resin 21.

The molding can be realized by transfer molding, injection molding, dipping, and painting. As a resin material, thermo-hardening resin such as epoxy resin can be used for transfer molding, and thermal plasticity resin such as liquid crystal polymer, polyphenylenesulfide can be used for injection molding.

The thickness of the insulating resin 21 is adjusted so that upper part from the top portion of the bonding wire 20, which is about 100 μm, is covered. This thickness can be controlled to be thick or thin considering the strength of the semiconductor device 23.

In filling, the flat member 30 does not shift because the conductive pattern is formed in one body with the flat member 30. Fixing the lower die and the back face of the flat member 30 is realized by vacuum suction. A depressing pin provided at the die may be used.

In the insulating resin 21, the conductive pattern 22 formed as the projection 31 and the semiconductor element 15 are buried, and the flat member 30 below the projection 31 is exposed from the back face of the insulating resin. (See FIG. 3.)

The flat member 30 exposed at the back face of the insulating resin 21 is then removed, and the conductive pattern 22 is separated individually.

Various methods may be considered for the separation process; that is, the back face may be removed by any method such as etching and polishing or grinding. For example, scraped chips of the flat member 30 and burr-shape metal extending to the outside encroaches on the insulating resin 21 so as to be thin. Therefore, grinding is stopped before the insulating resin 21 is exposed. Then, by separating the conductive pattern 22 by etching, the conductive pattern is formed without encroaching the metal of the flat member 30 on the insulating resin 21 positioned between the conductive patterns 22. That prevents a short between the conductive patterns 22 of fine intervals.

In half-etching, dispersion of thickness appears on the insulating resin 21 between the conductive patterns 22 by dispersion of etching depth. After separating the conductive patterns 22 individually by the etching method, grinding can be conducted to a predetermined thickness. Therefore, a package having a certain thickness can be formed.

Where a plurality of the semiconductor devices 23 are formed, a dicing process can be used to separate individually the semiconductor devices 23 after the separating process. The dicing line is shown by the thick dotted line.

Although the semiconductor devices are separated individually using the dicing equipment, breaking like breaking a chocolate, pressing, or cutting is also possible.

Figure 4B:
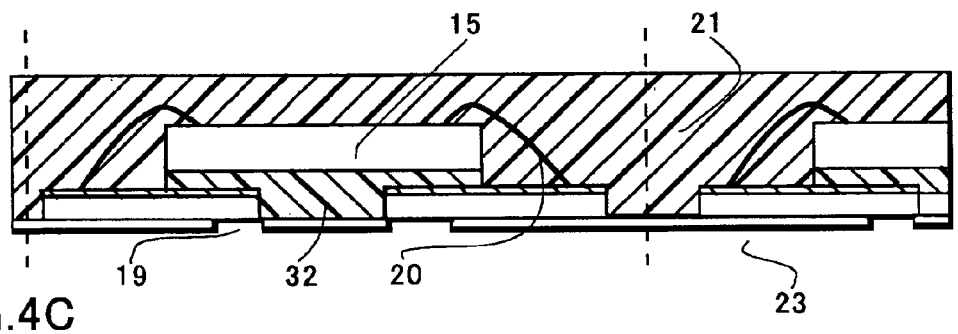

The conductive pattern 22 exposed at the back face may be exposed at a part corresponding to an electrode 19 as shown in FIG. 4B. For the exposed electrode 19, anisotropic conductive resin can be used for fitting a conductive ball such as a solder ball, and covering a conductive paste such as brazing material (e.g. Bolder) or a Ag paste.

Figure 4C:
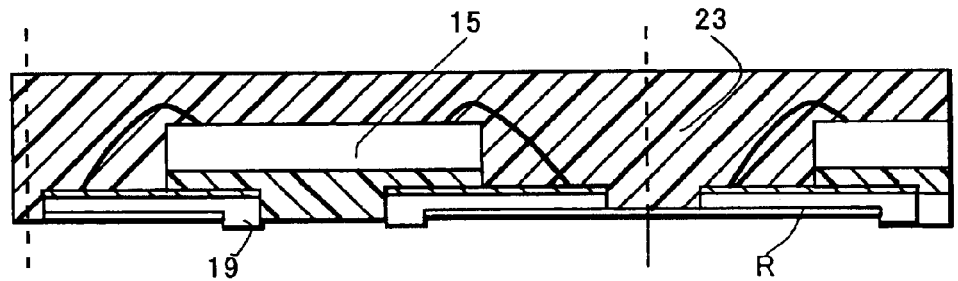

In FIG. 4C, etching is carried out through a photo resist formed on the exposed electrode 19. The exposed electrode 19 is made to project out. A conductive resin R is arranged so that the exposed electrode 19 would be exposed.

By coating the insulting resin R at the back face as shown in FIG. 4B and FIG. 4C, wiring of the mounting board side can be passed at the lower layer. By the above-mentioned method of manufacturing, a plurality of the conductive patterns 22, the semiconductor element 15, and the insulating resin 21 can be made into a light, thin, short, small semiconductor device of a BGA structure.

A flexible sheet used as a supporting board can be obviated because the conductive pattern 22 is half-etched and supported in one body with the flat member 30.

Making a fine conductive pattern 22 is possible because the conductive pattern 22, which is half-etched and has a projection, is formed on the flat member 30. Therefore, the width of the conductive pattern 22 and the interval between the conductive patterns 22 can be narrowed so that a smaller package is realized.

Because of construction of the three elements (a plurality of the conductive patterns 22, the semiconductor element 15, and the insulating resin 21), the semiconductor device consists of only the necessary elements, and nonessential material is removed so that a thin type semiconductor device 23 with reduced cost is realized.

Furthermore, because the second bonding pad 17, the wiring 18 and the electrode 19 are formed to project by half-etching, and the individual separation process is carried out after sealing, tie bar and hanging lead(support bar) used for the lead frame would not be needed so that pattern design becomes easy.

Although only one semiconductor element is mounted in the semiconductor device of the BGA structure in the discussion above, a plurality of semiconductor elements may further be mounted.

Fourth Embodiment

Figure 5A:
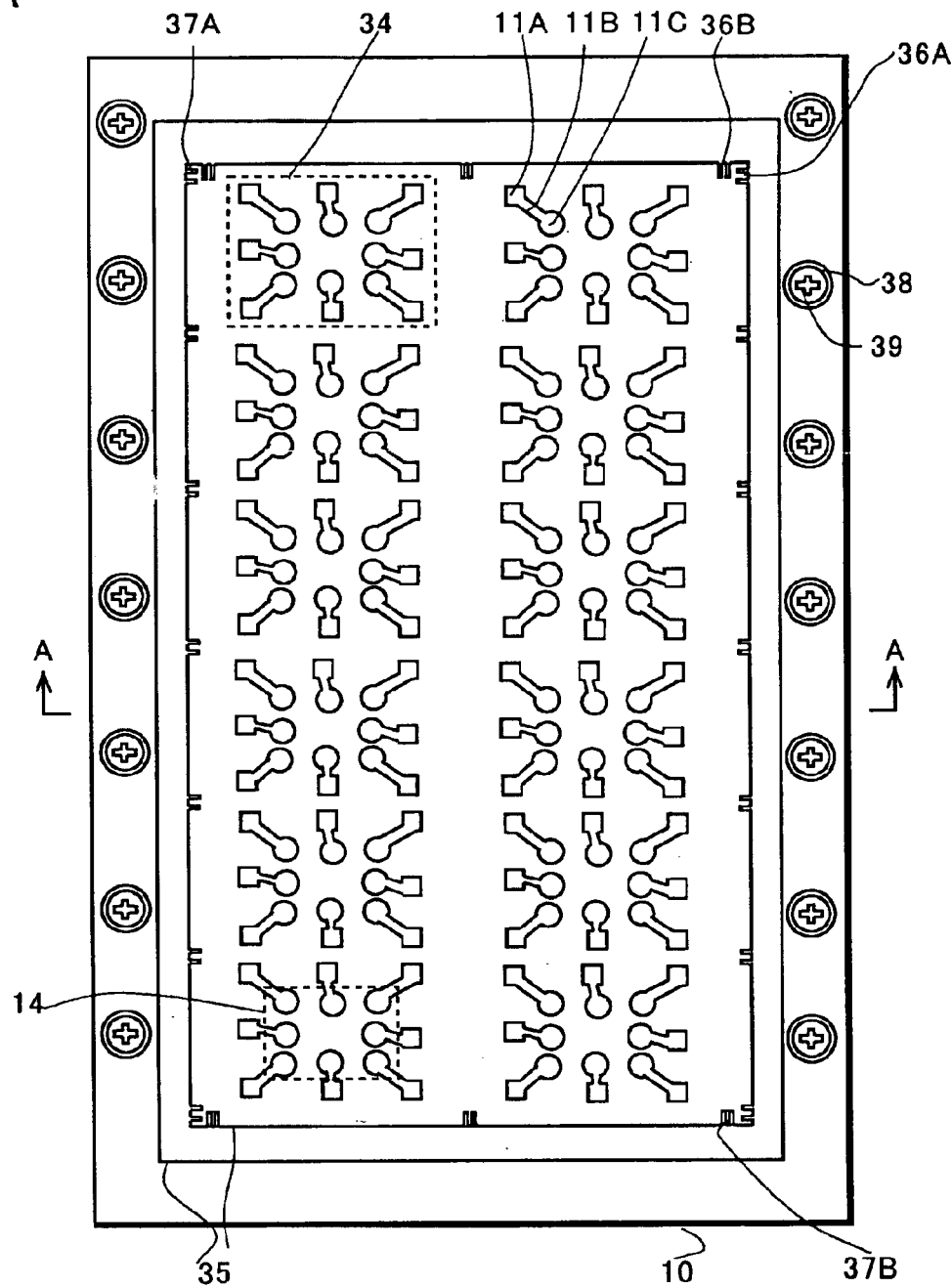
FIG. 5 shows a flat member of the invention.
Figure 5B:
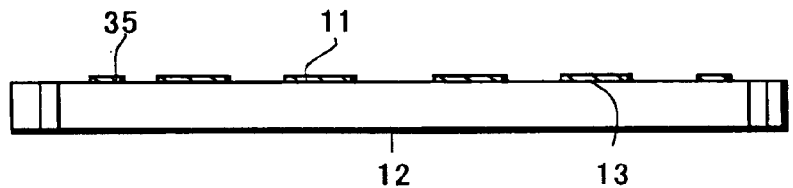

FIG. 5 shows a flat member 10 where a conductive film 11 forms a conductive pattern 22 similarly as in the first embodiment. An etching resist mask such as photo resist may be formed instead of the conductive film 11. In this case, a conductive film is formed at a part corresponding to a bonding pad, and a photo resist pattern is formed to cover the conductive film.

The pattern forming the pattern of FIG. 1 is shown in FIG. 5. A pattern unit 34 surrounded by dotted line corresponds to one semiconductor is replicated into matrix shape. A die contacting area 35 is formed in ring shape with a designated width and surrounds the pattern units 34. That is, the pattern of FIG. 5 shows the conductive pattern formed in one cavity.

At inside of the die contacting area 35, alignment marks 36 and 37 are provided. A line connecting the alignment marks 36A and 37A shows the dicing line in the lateral direction. A line connecting the alignment marks 36B and 37B shows dicing line in the longitudinal direction. Each alignment mark is formed by at least one short straight line, and the direction of the blade of the dicing equipment is adjusted by referencing the alignment marks. Here alignment mark is provided in the desired interval (margin) so that the blade can dice in desired accuracy.

Moreover, outside the die-contacting area 35, a first pattern 38 and a second pattern 39 for forming a guide hole are formed. The cross of the second pattern 39 serves as a centering mark when forming the guide hole with a drill. A guide hole with the same shape as the first pattern may be provided without forming the pattern.

Fifth Embodiment

Figure 6A:
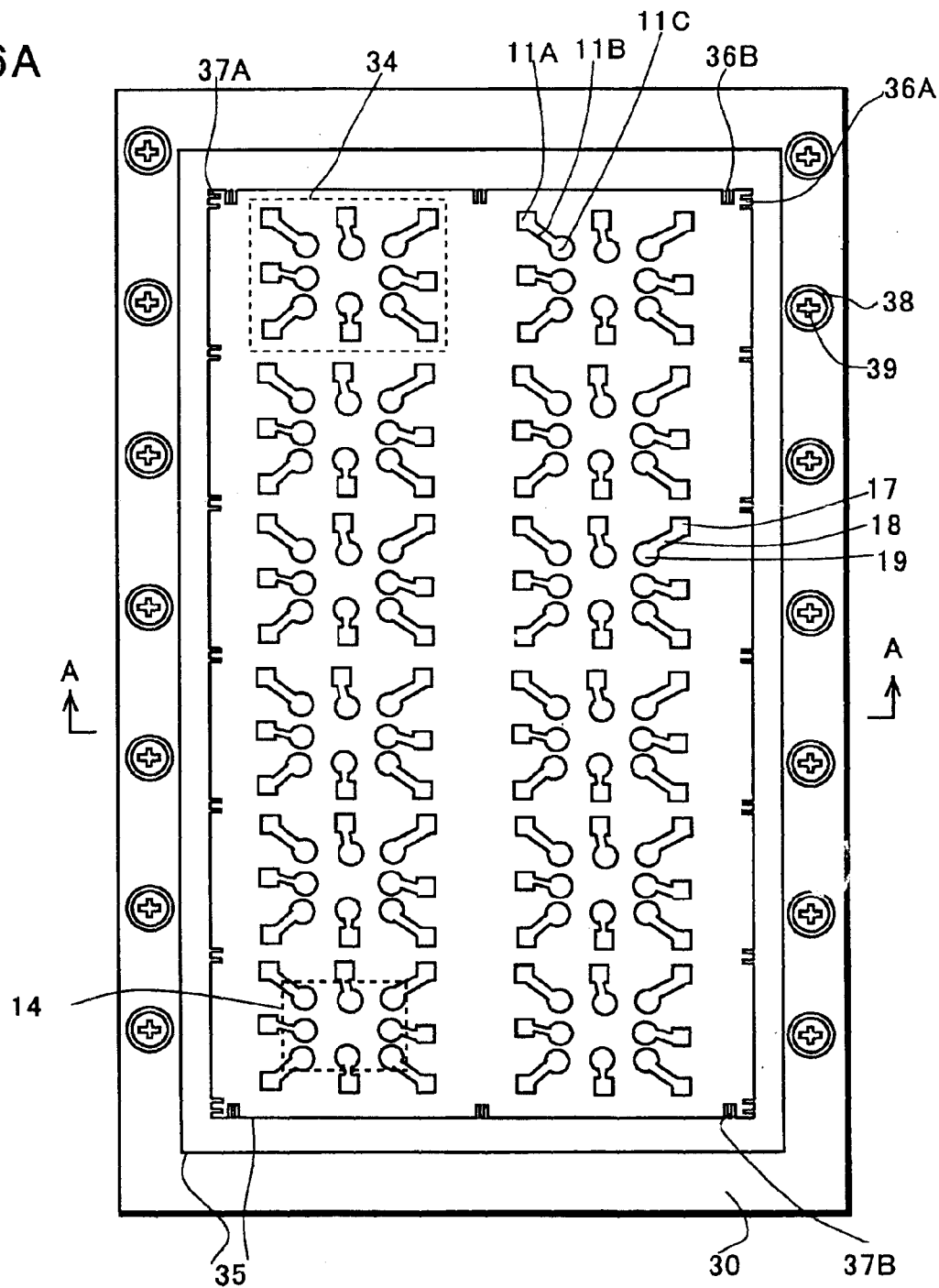
FIG. 6 shows a flat member of the invention.
Figure 6B:
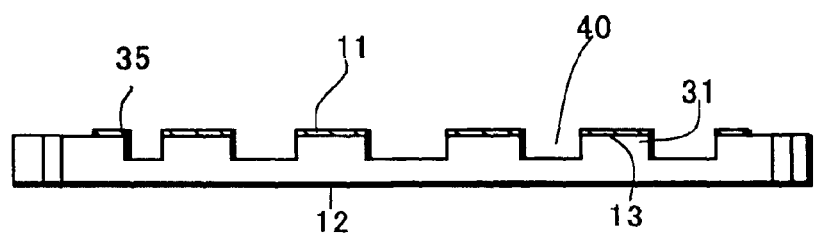

The flat member 30 has a shape shown in FIG. 6, and has a projection 31 half-etched through the etching-resist mask of the conductive film 11 or the photo resist as shown for the fourth embodiment. A first alignment mark 38 and a second alignment mark 39 may be formed in projection shape by half-etching.

The flat member 30 can behandled similarly as the conventional lead frame, SIP, DIP, QIP, and so on.

That is, a flat member 30 has a first face 12 including a flat face and a second face 13 having a projection 31 formed in a desired height and being formed opposite to the first face 12. The projection 31 includes a second bonding pad 17 provided at a periphery of a semiconductor element mounting area, a wiring 18 of one body with the second bonding pad 17, and an electrode 19 provided in one body with the wiring 18.

The flat member 30 has each pattern half-etched, and it would be possible to fix the semiconductor element, to connect electrically, and to seal with existing facilities for back processing.

Six Embodiment

A method for manufacturing the semiconductor device is described with reference to FIG. 5 to FIG. 11.

A flat member 10 is provided as in FIG. 5. Material for the flat member 10 is selected in consideration with adhesion of brazing material, and bonding and plating characteristics. They are a conductive foil, which can be mainly made of Cu or Al. The conductive foil can be also be an alloy of Fe—Ni, a layered product of Cu—Al, or a layered product of Al—Cu—Al. On the surface of the flat member 10, a second bonding pad 17, a wiring 18, an electrode 19, a die contacting area 35, alignment marks 36 and 37, patterns 38 and 39 can be formed by an etching-resist mask of a conductive film 11 or a photo resist.

It is desired that thickness of the conductive foil used for the flat member 10 be about 10 $\mu$m to 300 $\mu$m. In this embodiment, Cu foil of 70 $\mu$m (2 oz.) is used. However, the thickness may be more than 300 $\mu$m or less than 10 $\mu$m. (See FIG. 5.)

The flat member 10 is selectively removed except for area providing the second bonding pad 17, the wiring 18, the electrode 19, the die contacting area 35, the alignment marks 36 and 37, and patterns 38 and 39. Therefore, the certain regions are thinner than the thickness of the flat member 10.

Here the conductive film 11 or the photo resist is used as an etching-resist mask, and the isolation groove 40 is formed shallower than the thickness of the flat member 10.

In the method for manufacturing, the flat member is etched non-anisotropicaly by wet etching or dry etching, and has a characteristic that the side thereof has coarse face and made bend.

In the case of the wet etching, ferric chloride or cupric chloride is generally used for etchant. The conductive foil, for example, is dipped into the etchant or the etchant may be sprayed.

Especially, just under the conductive film 11 or a photo resist being an etching mask, etching in the lateral direction advances less than than at some deeper portion. Thus, the isolation groove 40 would have an opening diameter smaller than a diameter at some deeper portion, so that the opening has a reverse-tapered structure to provide an anchoring structure. By showering, etching is advanced to the depth direction and etching in the lateral direction is suppressed so that the anchor structure remarkably appears.

In the case of dry etching, both anisotropic and non-anisotropic etchings can be used. Although it is difficult to remove Cu by reactive ion etching nowadays, Cu can be removed by spattering. Depending on the condition of the spattering, both anisotropic and non anisotropic etchings are possible.

Material for the conductive film can be Ni, Ag, Au, Pt. These corrosive resistant conductive films can be used by itself for a bonding pad.

For example, a thin Au wire can be bonded to the conductive film of Ag and Au. Ni makes ultrasonic bonding with Al wire possible. Therefore, these conductive films can be used by itself for a bonding pad.

In the present embodiment, anisotropic etching can be used to form the projection. (See FIG. 6.)

Figure 7A:
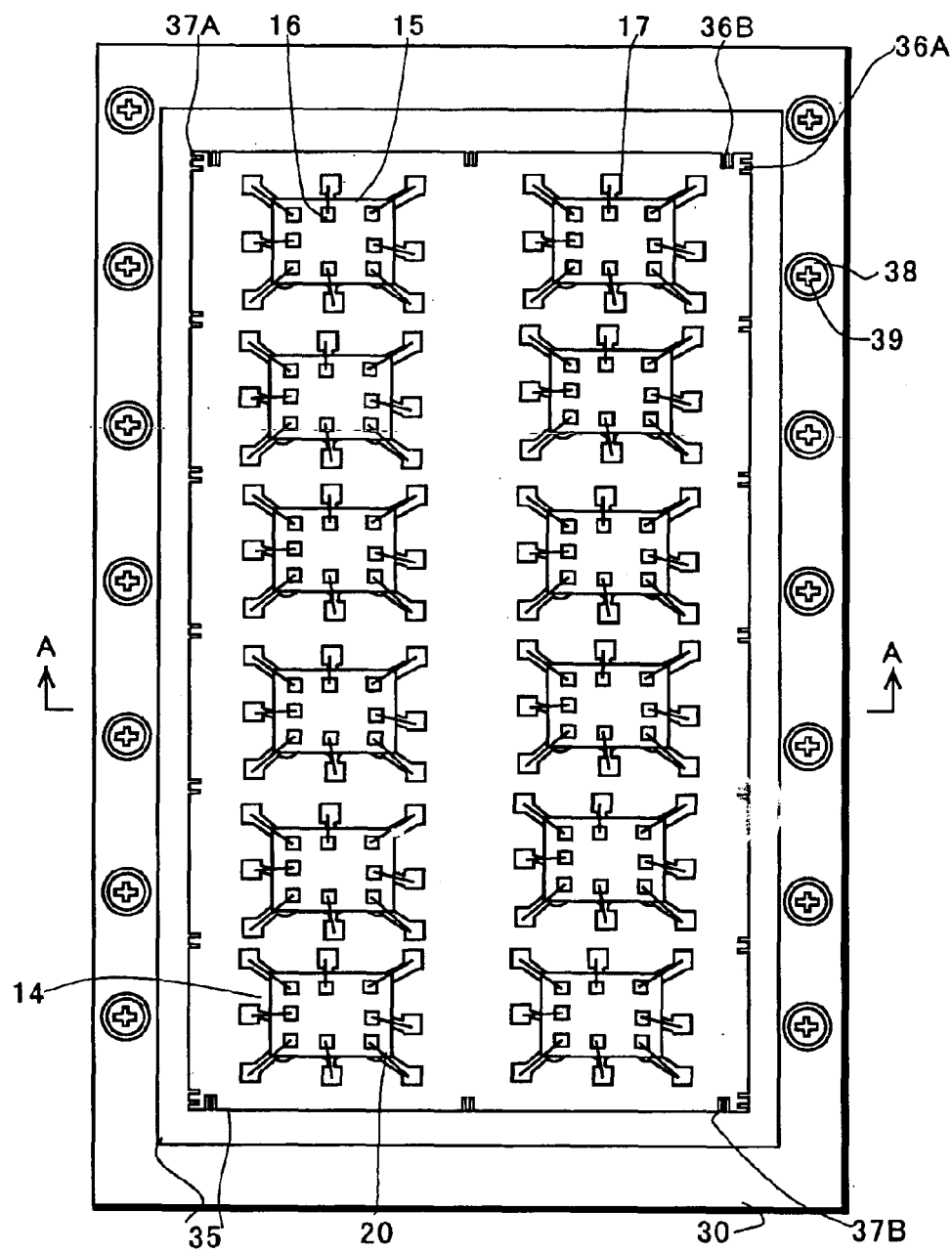
FIG. 7 illustrates a method for manufacturing a semiconductor device adopting a flat member of the invention.
Figure 7B:
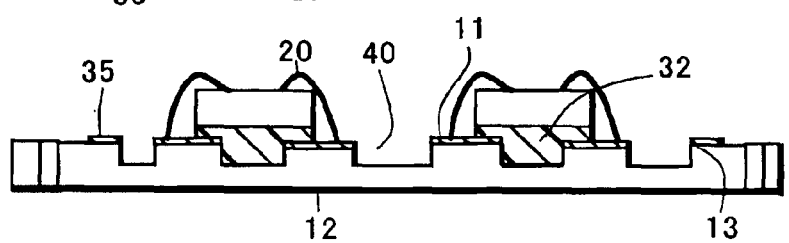
Figure 8A:
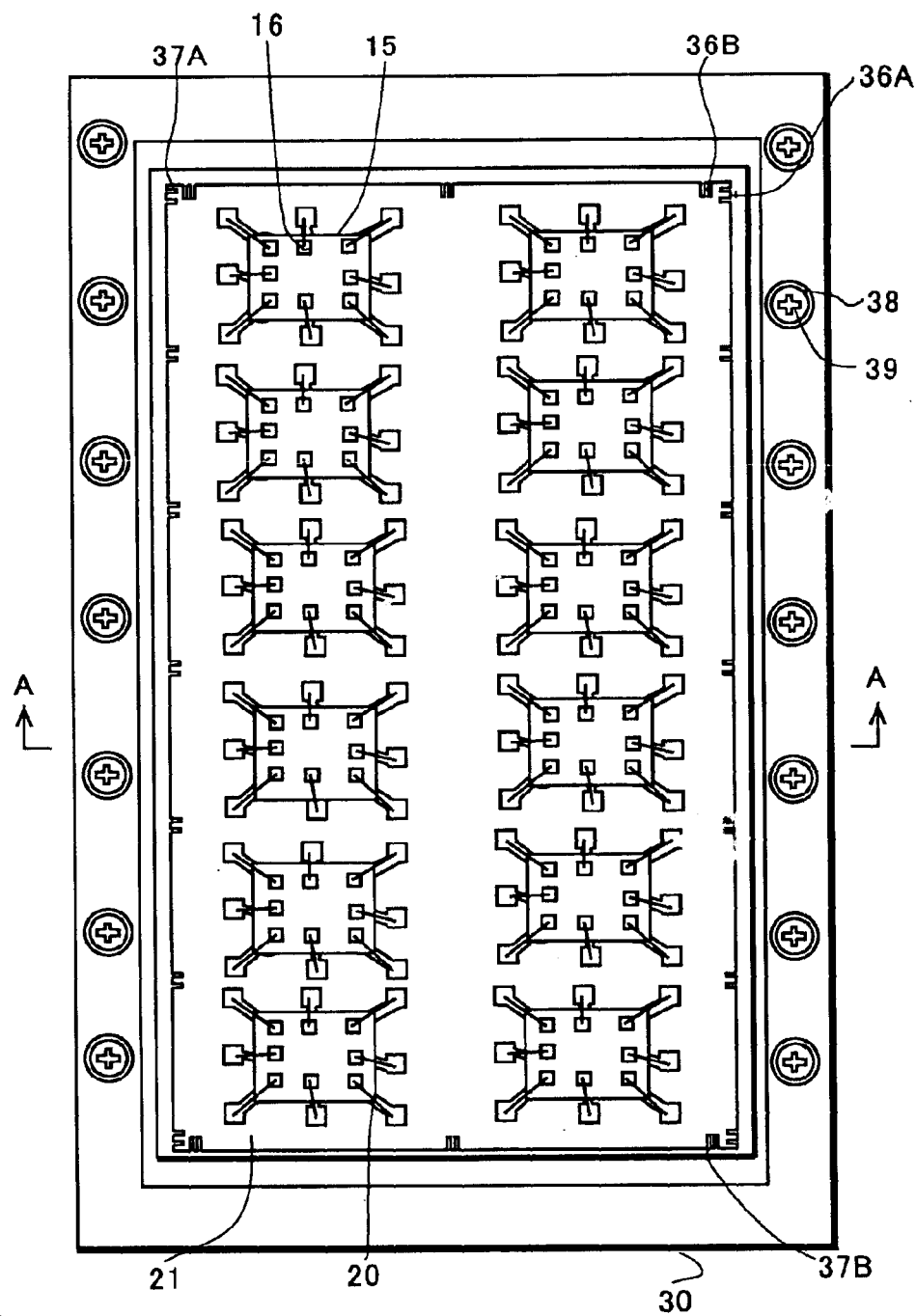
FIG. 8 illustrates a method for manufacturing a semiconductor device adopting a flat member of the invention.
Figure 8B:
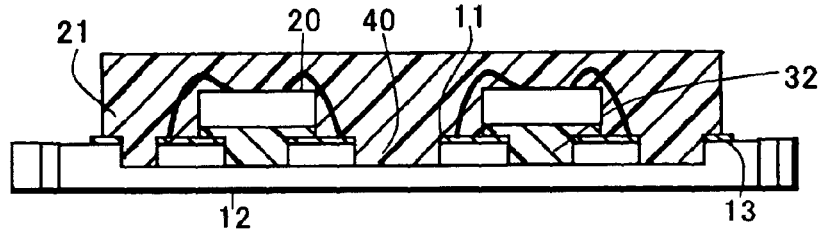

A mounting of the semiconductor element 15 on the semiconductor element mounting area 14 as shown in FIG. 7 is next discussed.

The semiconductor element 15 can be a transistor, a diode, or an IC chip. A CSP of wafer-scale type or SMD (semiconductor element of facedown type) of a BGA can be mounted, although they may increase thickness.

Here, a bare IC chip is fixed by an insulating adhesive 32. A first bonding pad 16 on the IC chip and a second bonding pad 17 are connected through a bonding wire 20 fixed by thermo-compression bonding or wedge bonding using ultrasonic waves.

The bonding pad 17 shown in the figure is made in one body with the flat member 30, though the size thereof is very small. Therefore, energy of a bonding tool can be transferred to the bonding pad 17 so that bonding ability is improved. A bonding wire can be pulled and cut after bonding. Because the second bonding pad 17 is made in one body with the flat member 30, the bonding pad 17 may be prevented from rising and the pull-cutting process is improved. (See FIG. 7.)

Moreover, an insulating resin 21 may be applied in an isolation groove 40. This is realized by transfer molding, injection molding, dipping, or painting. As resin material, thermo-hardening resin such as epoxy resin can be used for transfer molding, and thermal plasticity resin such as liquid crystal polymer or polyphenylenesulfide can be used for injection molding.

In the embodiment, the thickness of the insulating resin 21 is adjusted so that the upper part from the top portion of the bonding wire 20, about 100 $\mu$m, is covered. This thickness can be tailored based on the strength of the semiconductor device 23.

The flat member 30 functions as a supporting board untill the insulating resin 21 is covered and hardened. A supporting board of a flexible sheet is needed in the conventional BGA, but the present invention does not.

Moreover, because the insulating resin 21 is filled in the isolation groove 40 having a bended structure, an anchoring effect appears at this part so that the conductive pattern 22 is effectively prevented from peeling off from the insulating resin 21.

Putting silicon resin and the like is useful in order to protect the connecting portion of the semiconductor chip and the bonding wire, for example, before covering with the insulating resin 21.

Figure 9A:
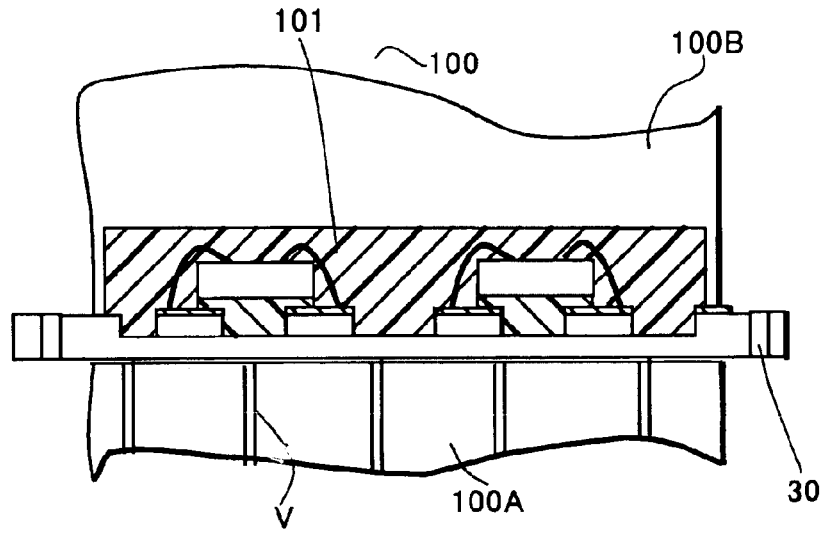
FIG. 9 illustrates a method for manufacturing a semiconductor device adopting a flat member of the invention.
Figure 9B:
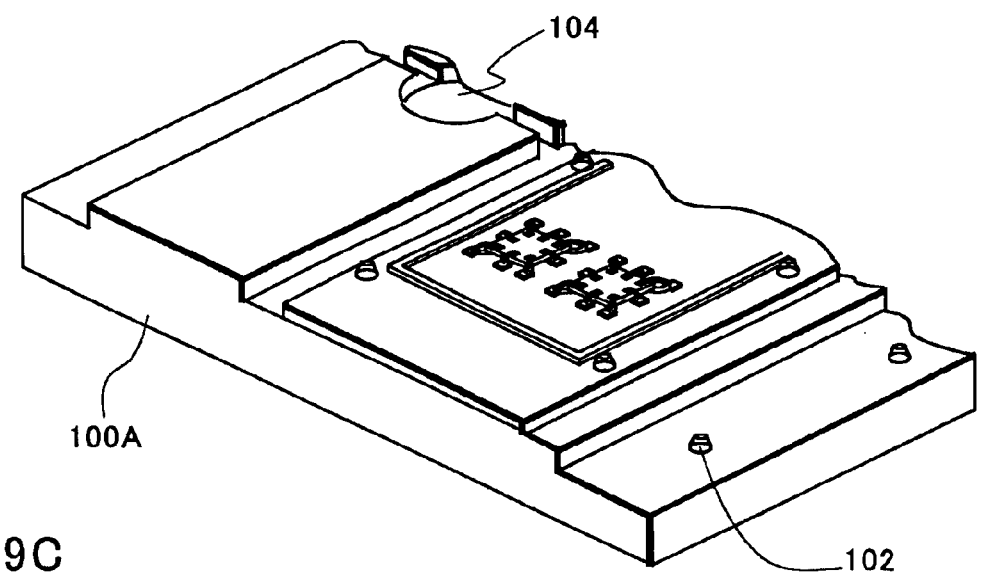

FIG. 9 shows a molding method. FIG. 9A is a section view showing the insulating resin 21 being filled into a cavity 101 in a die 100. The back face of the flat member 30 contacts a lower die 100A and upper die 100B contacts at a die contacting area. The symbol V is a vacuum suction hole. FIG. 9B shows the flat member 30 being mounted on the lower die 100A. Symbol 102 is a guide pin attached at the lower die 100A, and the guide pin appears through a guide hole opened at the flat member 30.

Figure 9C:
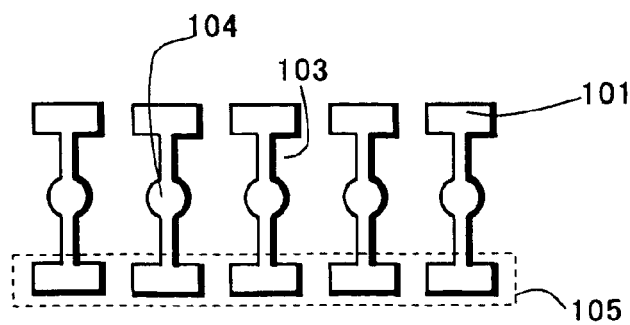

FIG. 9C shows a cavity 101, a runner 103, and a pot 104 formed at the die. As shown in the figure, the die is designed so that several cavities 101 are arranged in the lateral direction and many of the semiconductor devices are taken from one frame. Symbol 105 shown with dotted line shows an arranging area of the flat member, and the flat member 106 shown in FIG. 11, for example, is mounted similarly as in the conventional lead frame. The flat member 30 as shown in FIG. 6 is formed by using the die where plural cavities and so on are made in one body. The semiconductor device manufactured with the flat member itself is small in size, and is possible to take many devices in one cavity and to mass produce. This decreases the manufacturing cost. (See FIG. 8 and FIG. 9.)

Removing the flat member 30 exposed at the back face of the insulating resin 21 and separating the conductive pattern 22 are next discussed.

Figure 10A:
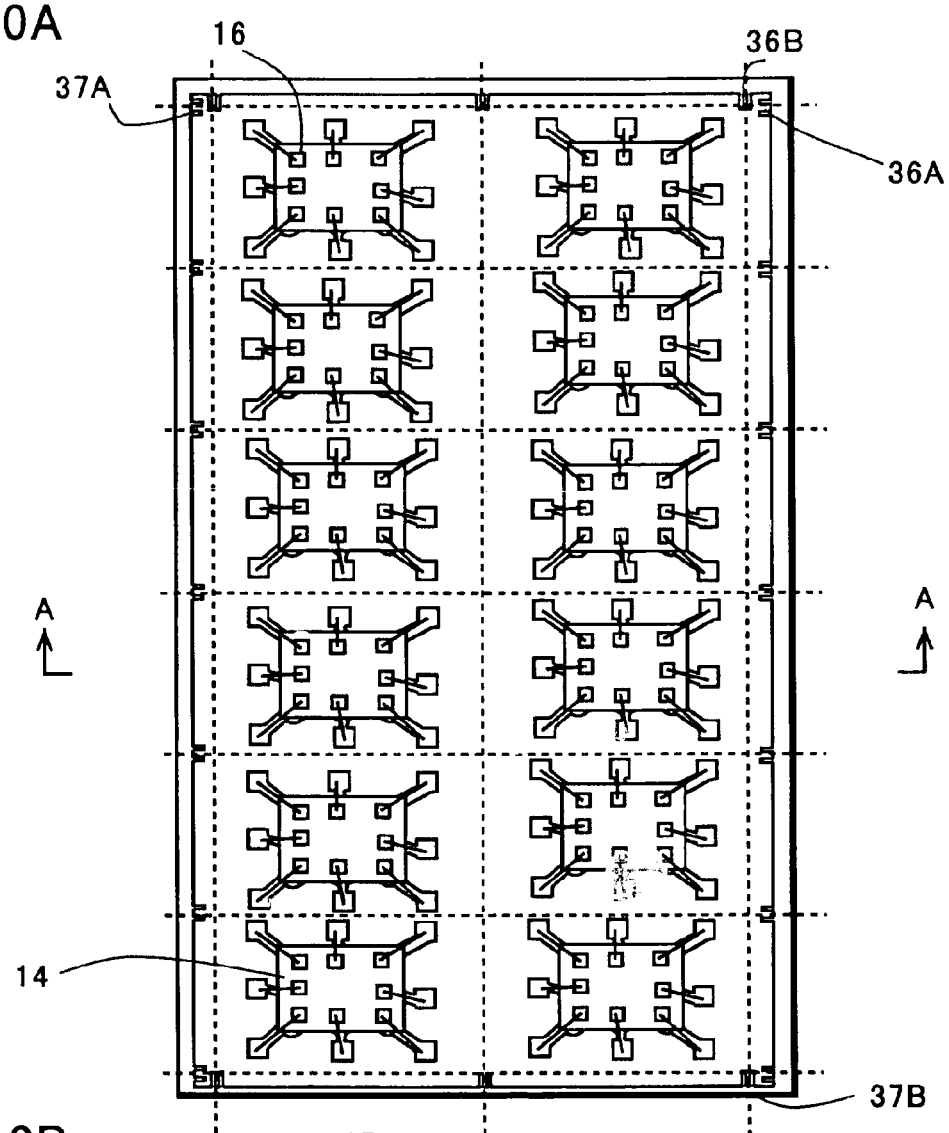
FIG. 10 illustrates a method for manufacturing a semiconductor device adopting a flat member of the invention.
Figure 10B:
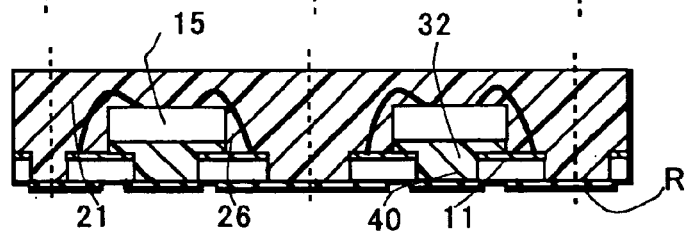

FIG. 10A shows the separation lines, and FIG. 10B shows that the back face of the insulating resin 21 and the second bonding pad 17, and shows how the back face of the insulating resin 21 and the wiring 18 and the electrode 19 fit together. This is possible by grinding off using polisher or grinder untill the isolation groove 40 is exposed. Only the part needing electrical connection may be exposed from an insulating film such as a solder resist.

Figure 10C:
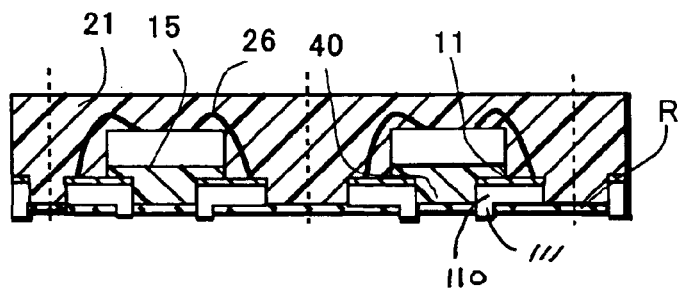
Figure 11:
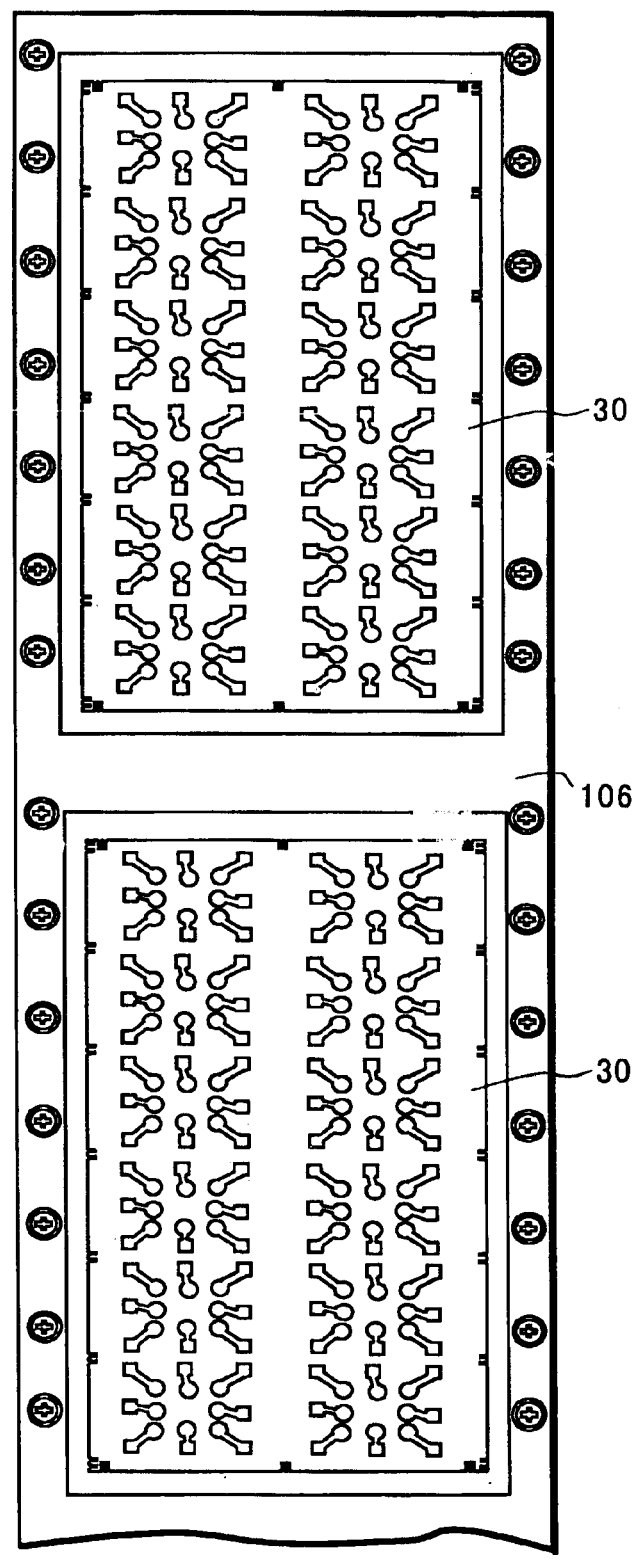
FIG. 11 shows a flat member adopted as a lead frame.

In FIG. 10C, a projection 111 is formed at the other end 110 of the electrode 19, by stopping the polishing appropriately. This is possible by forming a photo resist at a part corresponding to the projection 111 and by etching except the part. The insulating film R is formed so that the projection 111 is exposed. This process can prevent a short on the conductive member of the mounting board side passing under the semiconductor element 15.

The semiconductor device is completed by arranging the molding member on a dicing table, adjusting position of a blade by referring to the alignment marks 36 and 37, and dicing along the line shown by the dotted line.

Seventh Embodiment

Figure 12A:
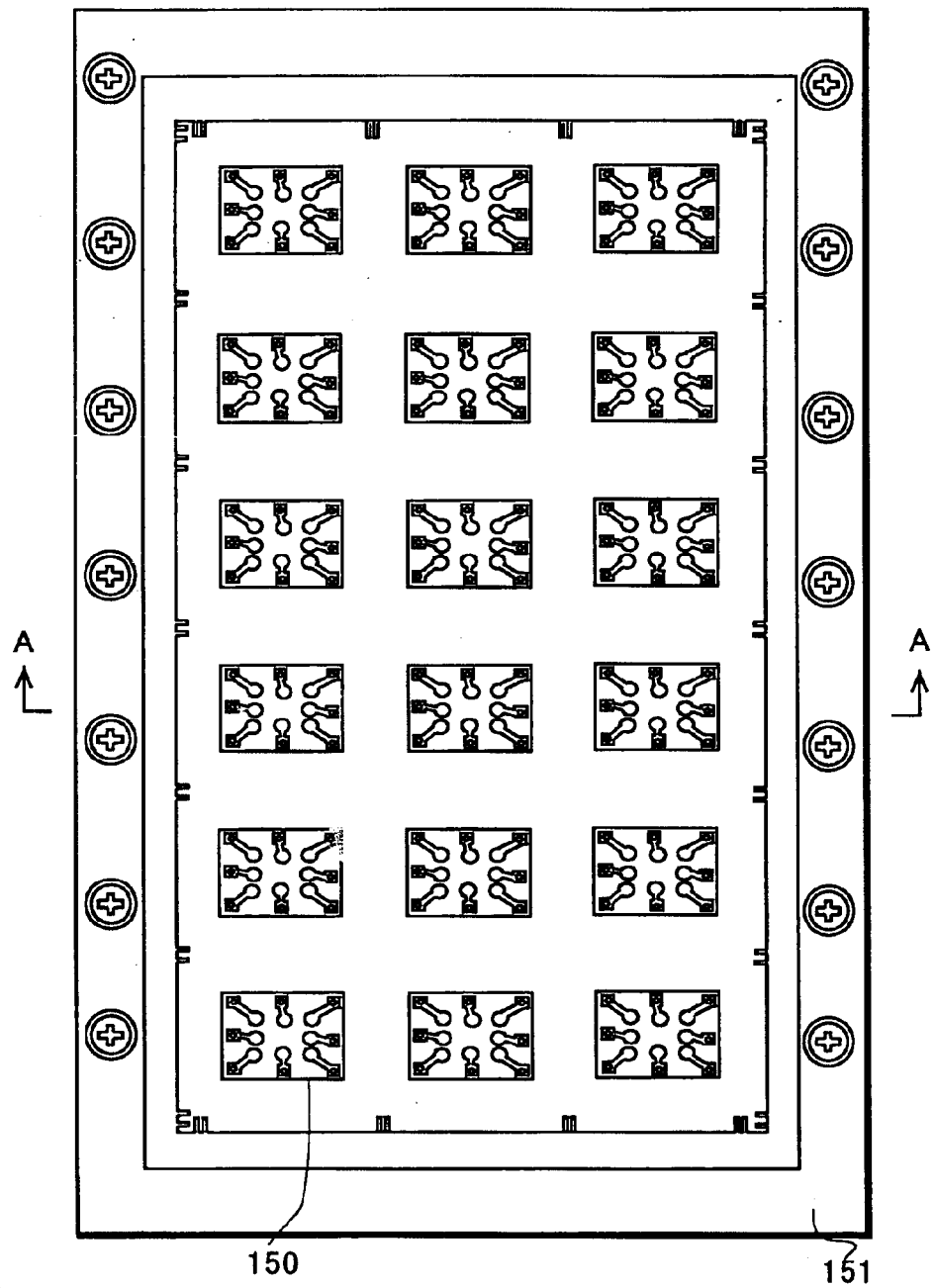
FIG. 12 illustrates a method for manufacturing a semiconductor device adopting a flat member of the invention.
Figure 12B:
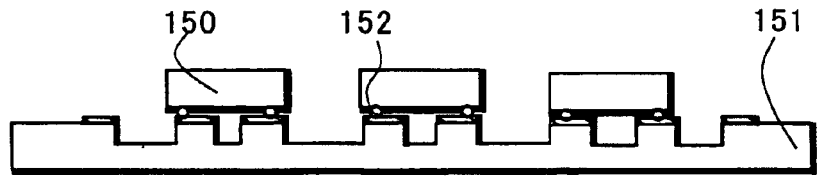
Figure 14A:
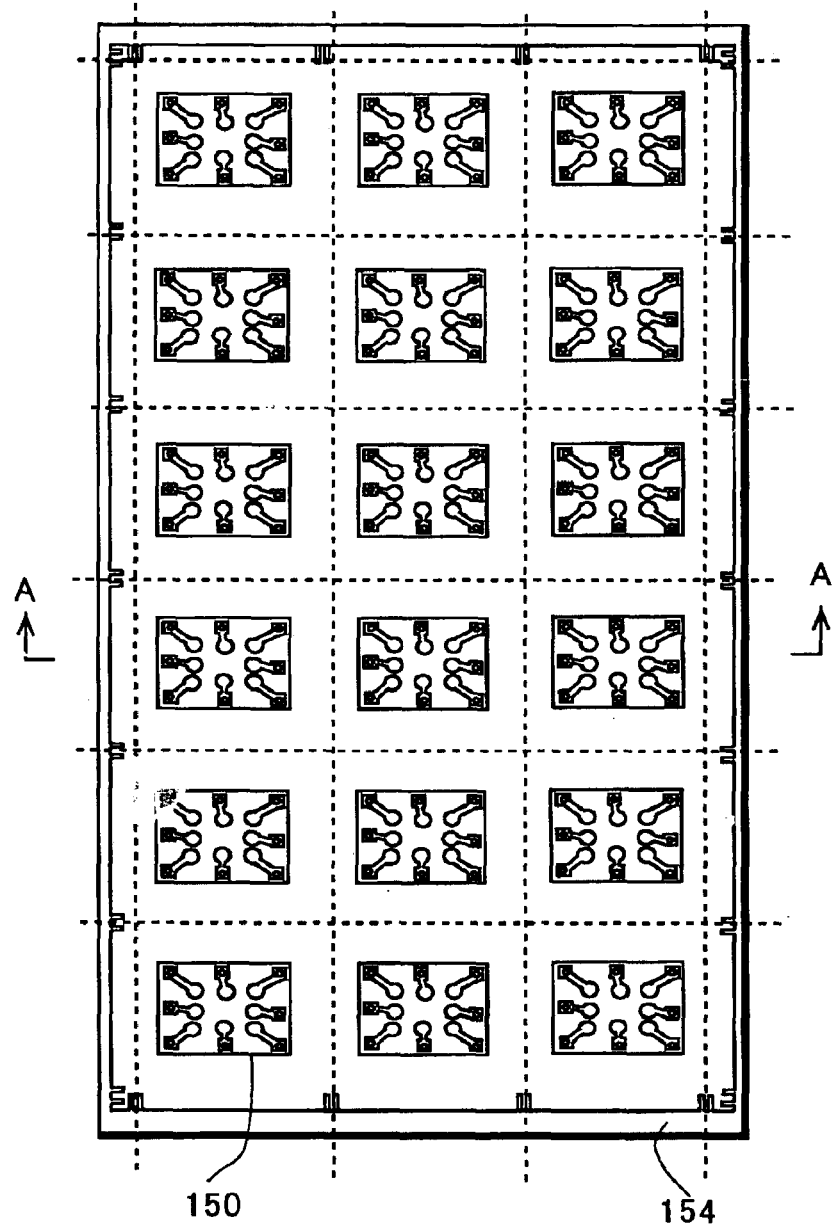
FIG. 14 illustrates a method for manufacturing a semiconductor device adopting a flat member of the invention.
Figure 14B:
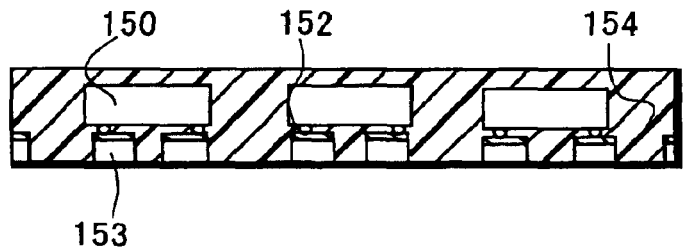

FIG. 12 to FIG. 14 show a semiconductor element 150 of facedown type on a flat member 151 and a manufacturing process of a semiconductor device of a BGA structure.

Although a conductive pattern 22 extends from the semiconductor element mounting area by using a bonding wire 20, it is possible to reduce or to remove the projection by adopting the facedown type. Although the thickness of the package may increase because the top of the bonding wire 20 becomes high, a thin type is possible by adopting the facedown type.

For the semiconductor element of facedown type, a solder ball 152, or bump of solder or Au instead of the solder ball is used.

In the case of fixing the semiconductor element 150 with brazing material such as solder, the conductive film like the bonding pad can be obviated because an electrode 153 consists of Cu as a main material. However, it may be needed for generating an anchoring structure having eaves.

The method is very similar to other methods described previously.

A flat member 151 is providing as shown in FIG. 12, and the solder ball 152 of the semiconductor element 150 is fixed on the flat member 151.

Next, the flat member is sealed using an insulating resin 154 as shown in FIG. 13.

Finally, the semiconductor device is completed by separating the conductive pattern, removing the flat member 151, positioning at the back face of the insulating resin 154, and dicing along the line shown with the dotted line as shown in FIG. 14.

A a part corresponding to the electrode may be exposed covering the insulating resin R on the back face of the package as shown in FIG. 10B and FIG. 10C.

By covering a conductive film with a small etching rate on the flat member and half-etching through the conductive film, eaves and bending structure can be formed to produce an anchoring effect. This is applicable in all the embodiments.

The method is suitable because Cu and Ni formed on the Cu are etched at the same rate by ferric chloride or cupric chloride and eaves of made of Ni can be formed by the difference in the etching rate.

The flat member of the invention has a structure for half-etching the conductive pattern through the conductive film or the photo resist. Moreover, the conductive pattern on the flat member can be formed by stop pressing or etching without removing the flat member from front to back. The construction adopting the half-etching process can make the interval of the conductive pattern narrow so that a pattern for finer semiconductor device of a BGA construction would be possible. Because a second bonding pad, the wiring, and the electrode are constructed in one body, deformation is suppressed. Moreover separating the conductive pattern is possible by polishing or etching the back face of the flat member after entirely sealing the insulating resin so that the conductive pattern can be arranged at the designated position without shifting. Further the wiring necessary for the semiconductor device of a BGA construction can be arranged without any deformation.

Arranging all of the conductive pattern area in the resin sealing area can remove burr generated from the conventional lead frame.

Forming the same pattern as the guide pin can open as the guide hole when sealing with the insulating resin. As the flat member is set on the guide pin of the die for sealing, resin sealing of high positional accuracy is possible.

When constructing the flat member with Cu as a main material and constructing the conductive film with Ni, Ag, Au or Pd, the conductive film can be used as an etching mask. Further when the flat member is half-etched, side thereof provides a bended structure and eaves by forming the conductive film at the surface of the conductive pattern. The flat member then has the structure having an anchoring effect.

The semiconductor device manufactured on the flat member consists of only the necessary elements of the semiconductor element, the conductive pattern, and the insulating resin. Therefore, the manufacturing cost can be reduced. Because the supporting board such as a flexible board, which has low thermal conductivity, is not used, thermal radiation can be increased. By optimizing the thickness of film of the insulating resin and thickness of the conductive foil, a small, thin, and light semiconductor can be realized.

The exposed back face of the conductive pattern from the insulating resin can instantly connect to the outside so that the through-hole such as in the flexible sheet of the conventional structure would not be needed.

The semiconductor device has a structure having a flat surface where the surface of the isolation groove and the surface of the conductive pattern are substantially the same. Any shifting of the electrode can be easily corrected because the semiconductor device itself is only moved horizontally even when mounting a narrow pitch GFP on the mounting board.

A side face of the conductive pattern has a bended structure, and eaves are formed at the front face. Therefore it is possible to generate an anchor effecting.

The flat member supports the entire device untill the insulating resin is covered. During the separation and dicing of the conductive pattern, the insulating resin serves to support the structure like a supporting board. Therefore, the supporting board described in the prior art would not be needed.

What is claimed is:

1. A board for manufacturing a BGA comprising:
   a flat member having a first face and a second face opposite to said first face, said second face having an area for mounting a semiconductor element;
   a first conductive film formed on said second face and provided at a periphery of the semiconductor element mounting area, said first conductive film corresponding to a bonding pad;
   a second conductive film integrated with the first conductive film and extending to said semiconductor element mounting area, said second conductive film corresponding to a wiring integrated with the bonding pad; and
   a third conductive film integrated with the second conductive film and disposed opposite to the first conductive film, said third conductive film corresponding to an electrode integrated with the wiring
   wherein at least some area of the flat member not under the conductive films is partially etched through.

2. A board for manufacturing a BGA comprising:
   a flat member having a first face and a second face opposite to said first face, said second face having an area for mounting a semiconductor element;
   a first photo resist formed on the second face and provided at a periphery of the semiconductor element mounting area, said first photo resist corresponding to a bonding pad;
   a second photo resist integrated with the first photo resist and extending to said semiconductor element mounting area, said second photo resist corresponding to a wiring integrated with the bonding pad; and
   a third photo resist integrated to the second photo resist and disposed opposite to the first photo resist, said third photo resist corresponding to an electrode integrated with the wiring
   wherein at least some area of the flat member not under the photo resist is partially etched through.

3. A board for manufacturing a BGA according to claim 2, wherein a conductive film is provided at area corresponding to said bonding pad and said photo resist is formed to cover the conductive film.

4. A board for manufacturing a BGA according to claim 1, wherein a substantially same pattern as a guide pin or a guide hole where said guides pin is inserted is formed at side parts of said flat member facing each other.

5. A board for manufacturing a BGA according to claim 1, wherein said flat member comprises a conductive foil and said conductive film comprises material different from said conductive foil.

6. A board for manufacturing a BGA comprising:
   a flat member having a first face and a second face opposite to said first face, and said second face having an area for mounting a semiconductor element; a first projection formed on said second face and provided at a periphery of the semiconductor element mounting area, said first projection corresponding to a bonding pad;
   a second projection integrated with the first projection and extending to said semiconductor element mounting area, said second projection corresponding to a wiring integrated with the bonding pad; and
   a third projection integrated with the second projection and disposed opposite to the first projection, said third projection corresponding to an electrode integrated with the wiring
   wherein at least some area of the flat member not under the projections is partially etched through.

7. A board for manufacturing a BGA according to claim 6, wherein a conductive film is formed on surface of said projection.

8. A board for manufacturing a BGA according to claim 7, wherein a conductive film is formed on at least an area corresponding to said bonding pad.

9. A board for manufacturing a BGA according to claim 6, wherein said flat member comprises a conductive foil and said conductive film comprises material different from said conductive foil.

10. A board for manufacturing a BGA according to claim 6, wherein a substantially same pattern as a guide pin or a guide hole where said guides pin is inserted is formed at side parts of said flat member facing each other.

11. A board for manufacturing a BGA according to claim 6, wherein a pattern of said projection is formed in a matrix manner.

12. A board for manufacturing a BGA according to claim 6, wherein said flat member comprises Cu, Al, Fe—Ni alloy, layered product of Cu—Al, or layered product of Al—Cu—Al.

13. A board for manufacturing a BGA according to claim 6, characterized in that side face of said projection has an anchor construction.

14. A board for manufacturing a BGA according to claim 6, characterized in that said conductive film constructs eaves at an upper face of said projection.

15. A board for manufacturing a BGA according to claim 14, wherein said conductive film is made of anyone of Ni, Au, Ag, and Pd.

16. A board for manufacturing a BGA comprising:
   a flat member having a first face as a resin sealing area and a second face opposite to the first face, said second face having a first projection disposed thereon, a second projection, and a third projection within an area surrounded by a contact area to an upper die;
   a semiconductor element mounting area within the area surrounding by the contact area;
   wherein the first projection is provided at a periphery of the semiconductor element mounting area, and said projection corresponds to a bonding pad;
   the second projection is integrated with the first projection and extends to said semiconductor element mounting area, and said second projection corresponds to a wiring integrated with the bonding pad;
   the third projection is integrated with the second projection and disposed opposite to the first projection, said third projection corresponds to an electrode integrated with the wiring; and
   at least the area surrounded by the contact area to said upper die constructs a sealing space with said second face and said upper die,
   wherein at least some area of the flat member not under the projections is partially etched through.

17. The board for manufacturing a BGA according to claim 16, further comprising:
   an insulating layer disposed in the semiconductor element mounting area.

18. A board for manufacturing a BGA according to claim 1, further comprising:

a plurality of alignment marks provided around the periphery of the flat member to facilitate dicing of the flat member.

19. A board for manufacturing a BGA according to claim 2, further comprising:

a plurality of alignment marks provided around the periphery of the flat member to facilitate dicing of the flat member.

20. A board for manufacturing a BGA according to claim 6, further comprising:

a plurality of alignment marks provided around the periphery of the flat member to facilitate dicing of the flat member.

21. A board for manufacturing a BGA according to claim 16, further comprising:

a plurality of alignment marks provided around the periphery of the flat member to facilitate dicing of the flat member.

* * * * *